(12) United States Patent
Lee

(10) Patent No.: US 9,318,630 B2
(45) Date of Patent: Apr. 19, 2016

(54) PIXEL WITH RAISED PHOTODIODE STRUCTURE

(71) Applicant: Taiwan Semiconductor Manufacturing CO., LTD., Hsinchu (TW)

(72) Inventor: Yueh-Chuan Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 134 days.

(21) Appl. No.: 14/132,702

(22) Filed: Dec. 18, 2013

(65) Prior Publication Data

US 2015/0171243 A1 Jun. 18, 2015

(51) Int. Cl.
| | |
|---|---|
| H01L 27/14 | (2006.01) |
| H01L 31/0352 | (2006.01) |
| H01L 31/18 | (2006.01) |
| H01L 21/76 | (2006.01) |
| H01L 27/146 | (2006.01) |

(52) U.S. Cl.
CPC ............ *H01L 31/0352* (2013.01); *H01L 21/76* (2013.01); *H01L 27/14632* (2013.01); *H01L 27/14647* (2013.01); *H01L 27/14687* (2013.01); *H01L 31/18* (2013.01); *H01L 27/14643* (2013.01)

(58) Field of Classification Search
CPC ................ H01L 31/18; H01L 31/0352; H01L 27/14609; H01L 27/14643; H01L 27/14603; H01L 27/14689; H01L 27/1463

USPC ............................................ 257/292; 438/59
See application file for complete search history.

(56) References Cited

U.S. PATENT DOCUMENTS

| | | | | |
|---|---|---|---|---|
| 2008/0173964 | A1* | 7/2008 | Akram | H01L 27/14621 257/432 |
| 2012/0091515 | A1* | 4/2012 | Yoo | H01L 27/14618 257/292 |

OTHER PUBLICATIONS

Borland, John O. , "Novel Device Structures By Selective Epitaxial Growth (SEG)", *Electron Devices Meeting, 1987 International*, vol. 33, Dec. 6-9,1987 , p. 12-15.
Waite, A.M. et al., "Raised Source/Drain (RSD) for 50nm MOSFETs—Effect of Epitaxy Layer Thickness on Short Channel Effects", *33rd Conference on European Solid-State Device Research*, pp. 223-226 , 2003.
Yangfan, Zhou et al., "Image Lag Optimization of Four-Transistor Pixel for High Speed CMOS Image", *Proc. Of SPIE* vol. 8194 819435-1 Aug. 18, 2011, pp. 819435-1 to 819435-6.

* cited by examiner

*Primary Examiner* — Monica D Harrison

(57) ABSTRACT

An active pixel cell includes an isolation feature and a photodiode, in which the active pixel cell is on a semiconductor substrate with a top surface. The isolation feature is in the top surface of the semiconductor substrate. The photodiode is adjacent to the isolation feature. The photodiode includes a first-type pinned photodiode (PPD) and a second-type PPD. The first-type PPD is in the pixel region, in which the first-type PPD has a first-type PPD surface coplanar with the top surface. The second-type PPD is on the first-type PPD surface, in which the second-type PPD has a second-type PPD surface which is elevated higher than the first-type PPD surface.

17 Claims, 23 Drawing Sheets

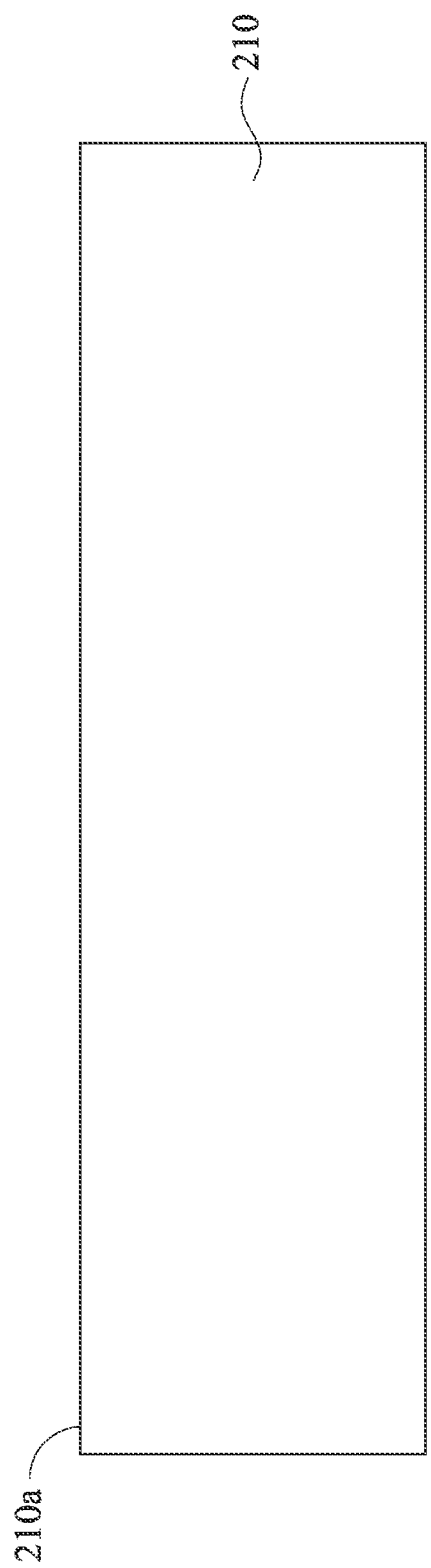

PIXEL WITH RAISED PHOTODIODE STRUCTURE

BACKGROUND

Complementary Metal-Oxide-Semiconductor (CMOS) image sensors (CIS) are used in numerous applications including digital still cameras. In semiconductor technologies, image sensors are used for sensing exposed light projected toward a semiconductor substrate. Generally, CIS products include a pixel (or pixel array) region and a periphery region. These products utilize an array of active pixels (i.e., image sensor elements or cells) including photodiodes and other elements (e.g., transistors) to convert images into digital data or electrical signals. Each of the photodiodes includes a p-type pinned photodiode and a n-type pinned photodiode to form a pn junction for transforming photons into electrons, and the photodiodes are determined by a dark current (DC) or a white pixel (WP) performance affected by various factors.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 2A-2G are schematic cross-sectional views of intermediate stages showing a method for fabricating an image sensor device in accordance with some embodiments;

DETAILED DESCRIPTION

Figure 1A:
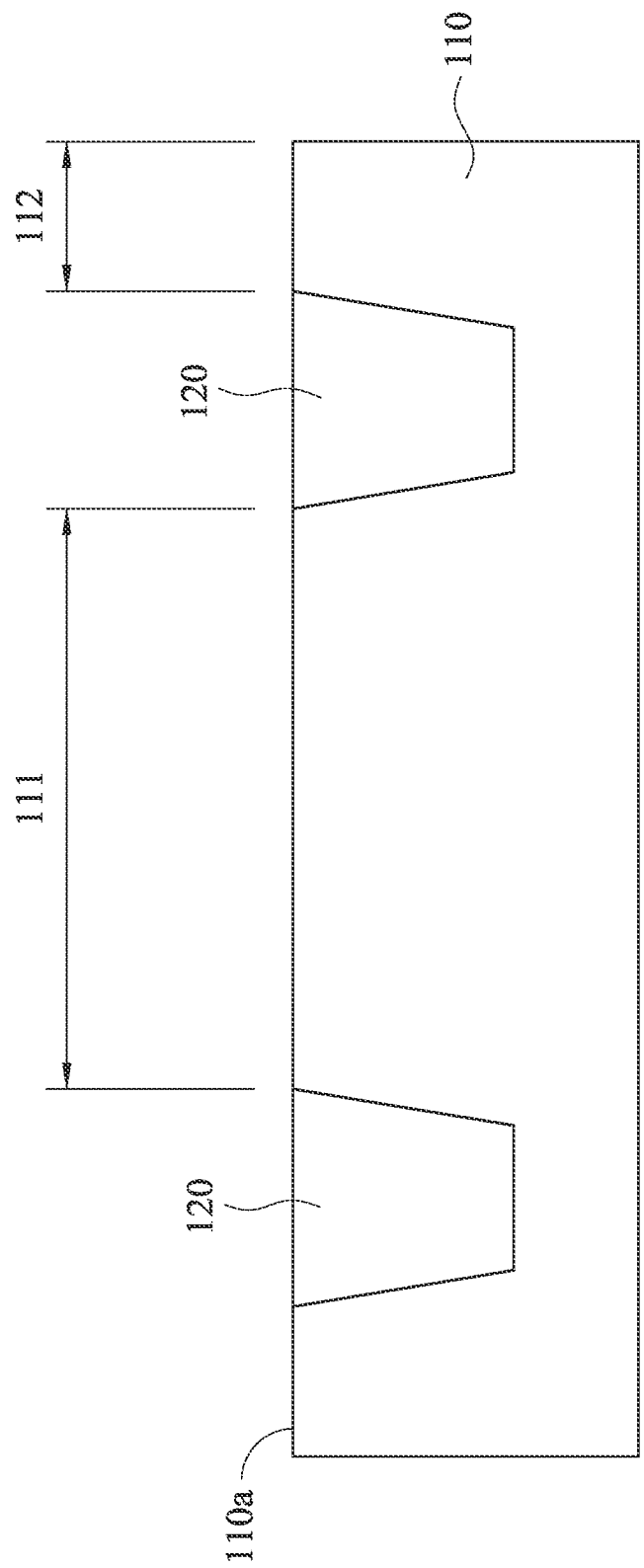
FIG. 1A-1B are schematic cross-sectional views of intermediate stages showing a method for fabricating an active pixel cell in accordance with some embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

In general, an imperfect surface of a photodiode formed in a semiconductor substrate may degrade the DC or WP performance. In some approaches, the p-type pinned photodiode and the n-type pinned photodiode may be fabricated by implanting ions into the pixel (or pixel array) region, and a surface of the pixel region of the semiconductor substrate may be damaged by the ions, thus degrading the DC or WP performance.

Further, each of the photodiodes may include an n-type pinned photodiode and a p-type pinned photodiode. The n-type pinned photodiode may be formed in a p-type semiconductor substrate and then the p-type pinned photodiode is formed and embedded in a portion of the n-type pinned photodiode. The remaining portion of the n-type pinned photodiode is adjacent to the aforementioned transistor, and the aforementioned electrons may move through the remaining portion of the n-type pinned photodiode to a channel below and controlled by the transistor. However, the remaining portion has a relatively small area, which results in an additional potential barrier in the boundary between the p-type pinned photodiode and the transistor, and is disadvantageous to transferring the electrons and inducing an image lag accordingly. On the contrary, if the remaining portion has a relatively large area (which means relatively thinner p-type pinned photodiode embedded in the n-type pinned photodiode), the DC or WP performance is poorer. Therefore, a trade-off exists between the image lag and the DC or WP performance.

Furthermore, a thickness of the p-type pinned photodiode influences the DC or WP performance. In general, the greater thickness may improve the DC or WP performance because a PN junction (formed by the p-type pinned photodiode and the n-type pinned photodiode) is far away from a surface between the p-type pinned photodiode and an oxide layer (such as a protective layer) formed on the p-type pinned photodiode. However, the thickness of the p-type pinned photodiode is limited to that of the n-type pinned photodiode, and improvements on the DC or WP performance are restricted.

Embodiments of the present disclosure provide an active pixel cell for CIS devices to sense lights emitted to the front or back side of the CIS devices by providing a raised photodiode structure. The raised photodiode structure includes a first-type pinned photodiode (PPD) and a second-type PPD, in which the first-type and the second-type may be n-type and p-type respectively. The n-type PPD (NPPD) is formed in a pixel region of a semiconductor substrate such as by using an implanting operation. The NPPD has a NPPD surface coplanar with a top surface of the semiconductor substrate. The p-type PPD (PPPD) is formed on the NPPD surface such as by using a selective epitaxy growth (SEG) and in-situ doping process, thereby preventing a surface of the pixel region of the semiconductor substrate from being damaged. Further, the PPPD is formed on the NPPD surface instead of the conventional implanting operation of embedding the PPPD in the NPPD. A thickness of the PPPD is not limited to that of the NPPD, and can improve trade-off between the image lag and the DC or WP performance.

According to various embodiments of the present disclosure, the aforementioned active pixel cell may be formed together with a logic circuit (such as a CMOS logic circuit) to form a CIS device.

Figure 1B:
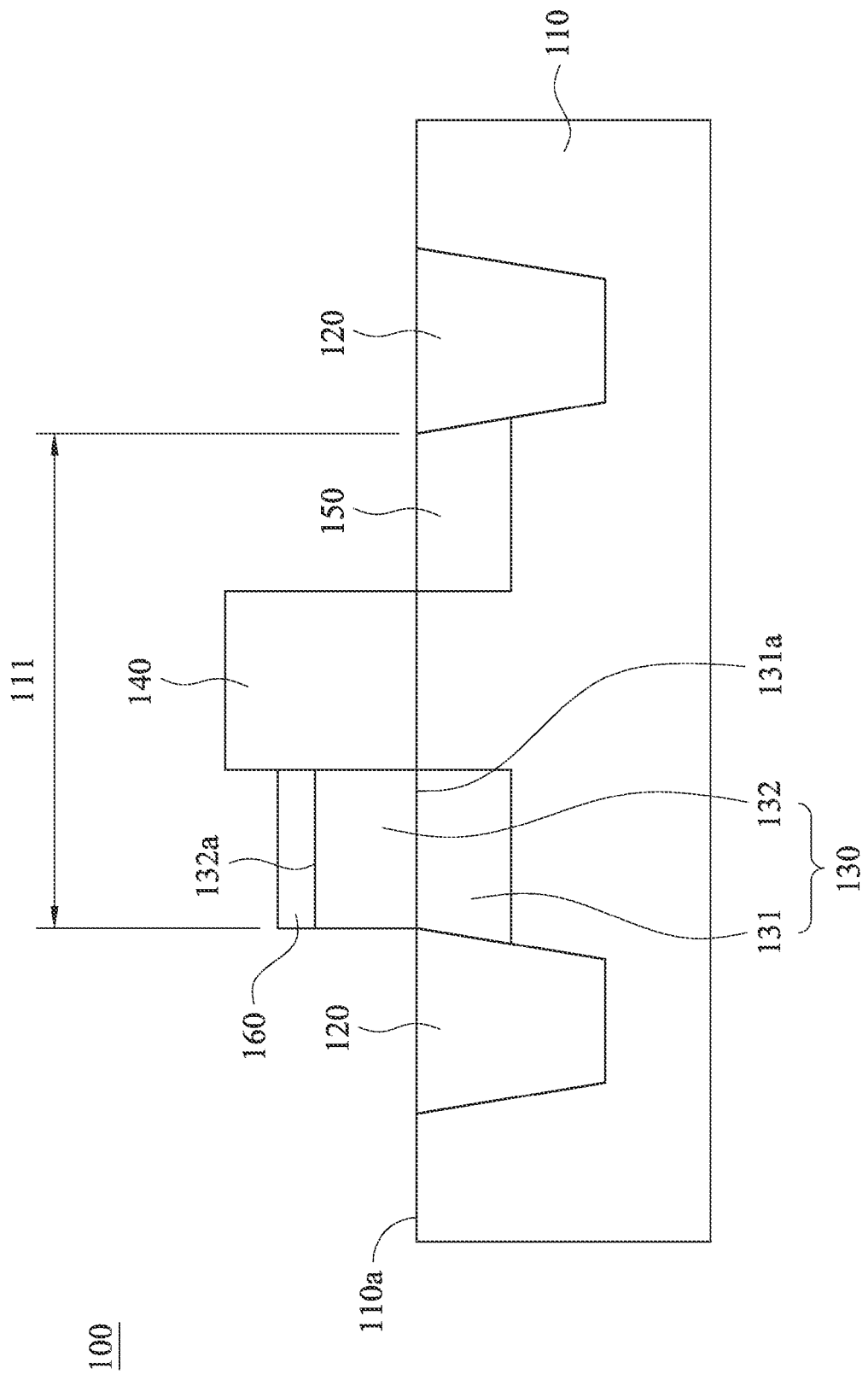

FIG. 1A-1B are schematic cross-sectional views of intermediate stages showing a method for fabricating an active pixel cell 100 in accordance with some embodiments. As shown in FIG. 1A, an isolation feature 120 is provided in a top surface 110a of a semiconductor substrate 110. In some embodiments, the semiconductor substrate 110 is formed from such as silicon. Other commonly used materials, such as carbon, germanium, silicon-germanium, gallium, arsenic, nitrogen, indium, phosphorus, and/or the like, may also be included in the semiconductor substrate. The semiconductor substrate 110 may be formed from a single-crystalline semiconductor material or compound semiconductor materials, and may be a bulk substrate or a semiconductor-on-insulator (SOI) substrate.

In some embodiments, the isolation feature 120 including, such as a silicon oxide, a trench isolation, silicon dioxide or a field oxide (FOX), is disposed in the semiconductor substrate 110 to define a pixel region 111 and a periphery region 112 of the semiconductor substrate 110. In some embodiments, some isolation features 120 may be shallow trench isolations (STIs) used to separate and isolate photo diodes, memory cells or SRAM cells in an array area, and some isolation features 120 are deep trench isolations used to separate and isolate NMOS and PMOS devices in the peripheral area. The structures, materials, depth of the STI and the deep trench isolation can be different in different area. Specific STI profile and material may be needed for meeting certain device requirements.

As shown in FIG. 1B, a photodiode 130 is formed and is adjacent to the isolation feature 120. The photodiode 130 includes a first-type pinned photodiode (PPD) 131 and a second-type PPD 132 formed on the first-type PPD 131, in which the first-type PPD 131 has a first-type PPD surface 131a coplanar with the top surface 110a and the second-type PPD 132 has a second-type PPD surface 132a which is elevated higher than the first-type PPD surface 131a.

In some embodiments, the first-type PPD 131 is formed in the pixel region 111 using an implanting process at an energy in a range from about 35 KeV to about 200 KeV, at a dose concentration in a range from about from about $5 \times 10^{14}$ to $1 \times 10^{18}$ atoms/cm$^3$.

In some embodiments, the second-type PPD 132 is formed on the first-type PPD 131 by using a selective epitaxy growth (SEG) and in-situ doping process, thereby preventing a surface of the pixel region 111 of the semiconductor substrate 110 from being damaged. In alternative embodiments, the doping concentration of the second-type PPD 132 is in a range from about $5 \times 10^{15}$ atoms/cm$^3$ to about $1 \times 10^{19}$ atoms/cm$^3$.

It is mentioned that, the second-type PPD 132 is formed on the first-type PPD 131 instead of being embedded therein, such that the thickness of the second-type PPD 132 is not limited to that of the first-type PPD 131, thus improving the DC or WP performance by increasing the thickness of the second-type PPD 132. Besides, the region of the second-type PPD 132 is not limited to the region of the first-type PPD 131 (because the second-type PPD 132 is not embedded in the first-type PPD 131). The region of the second-type PPD 132 may be adjusted to improve the DC or WP performance. Further, as mentioned in the aforementioned description, electrons (which are transformed from photos) in the first-type PPD are not blocked by the second-type PPD, therefore the additional potential barrier is not produced and the aforementioned image lag is improved. In some embodiments, the thickness of the second-type PPD 132 is in a range from about 10 nm to about 200 nm, or about 30 nm to about 50 nm.

In some embodiments, the active pixel cell 100 further includes a transistor gate 140 (such as a transfer transistor or a reset transistor) and a first-type drain region 150, thereby controlling the operation of the active pixel cell 100. The transistor gate 140 is formed after the operation of forming the isolation feature 120.

In some embodiments, the second-type PPD 132 is protected by a protective oxide 160 formed thereon, in which the protective oxide 160 has a thickness in a range about 1 nm to about 100 nm. The protective oxide 160 may be formed by using a rapid process oxidation process, a low pressure chemical vapor deposition (LPCVD) process or a plasma enhanced chemical vapor deposition (PECVD) process.

Figure 2B:
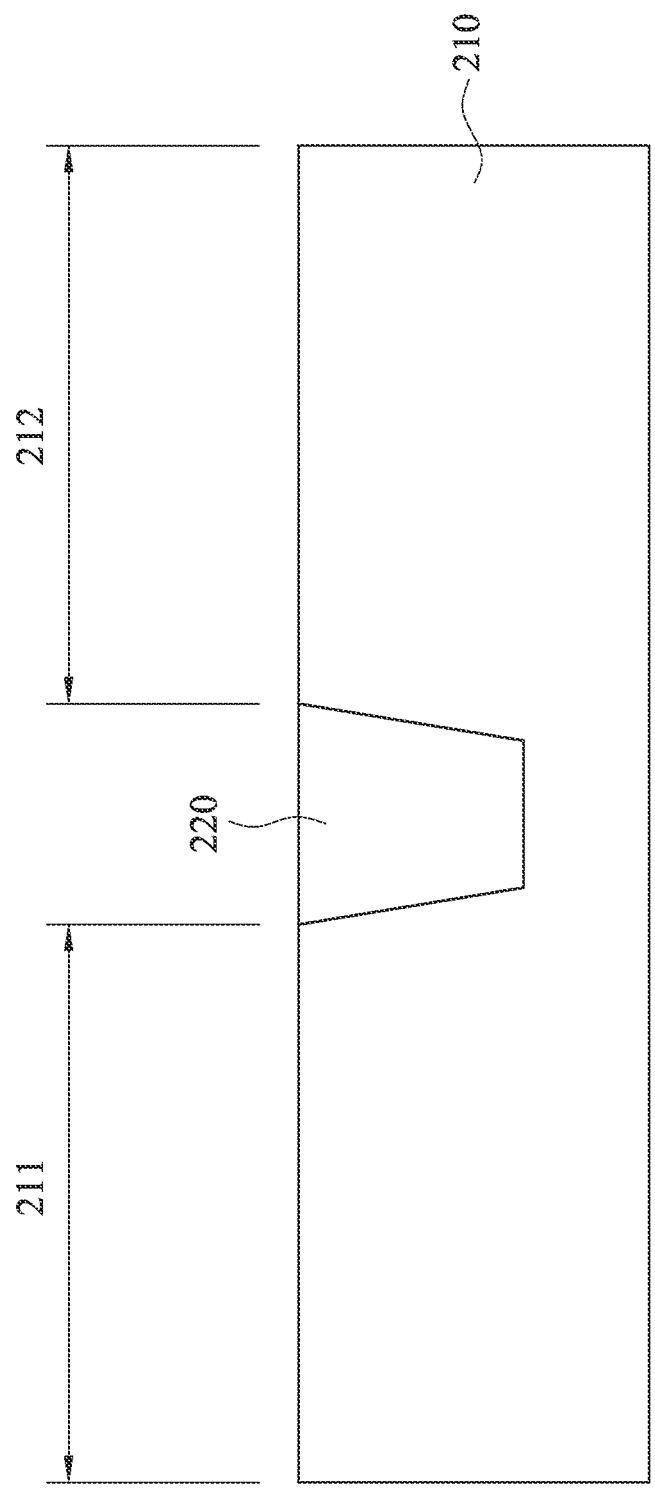

FIG. 2A-2G are schematic cross-sectional views of intermediate stages showing a method for fabricating an image sensor device 200 in accordance with some embodiments. As shown in FIG. 2A, a semiconductor substrate 210 with a top surface 210a is provided. In some embodiments, the semiconductor substrate 210 is formed from such as silicon. Other commonly used materials, such as carbon, germanium, silicon-germanium, gallium, arsenic, nitrogen, indium, phosphorus, and/or the like, may also be included in the semiconductor substrate. The semiconductor substrate 210 may be formed from a single-crystalline semiconductor material or compound semiconductor materials, and may be a bulk substrate or a SOI substrate.

As shown in FIG. 2B, an isolation feature 220 is disposed in the top surface 210a to define a pixel region 211 and a periphery region 212 of the semiconductor substrate 210. In some embodiments, some isolation features 220 may be shallow trench isolations (STIs) used to separate and isolate photo diodes, memory cells or SRAM cells in an array area, and some isolation features 220 are deep trench isolations used to separate and isolate NMOS and PMOS devices in a peripheral area. The structures, materials, depth of the STI and the deep or shallow trench isolation can be different in different area. Specific STI profile and material may be needed for meeting certain device requirements.

Figure 2C:
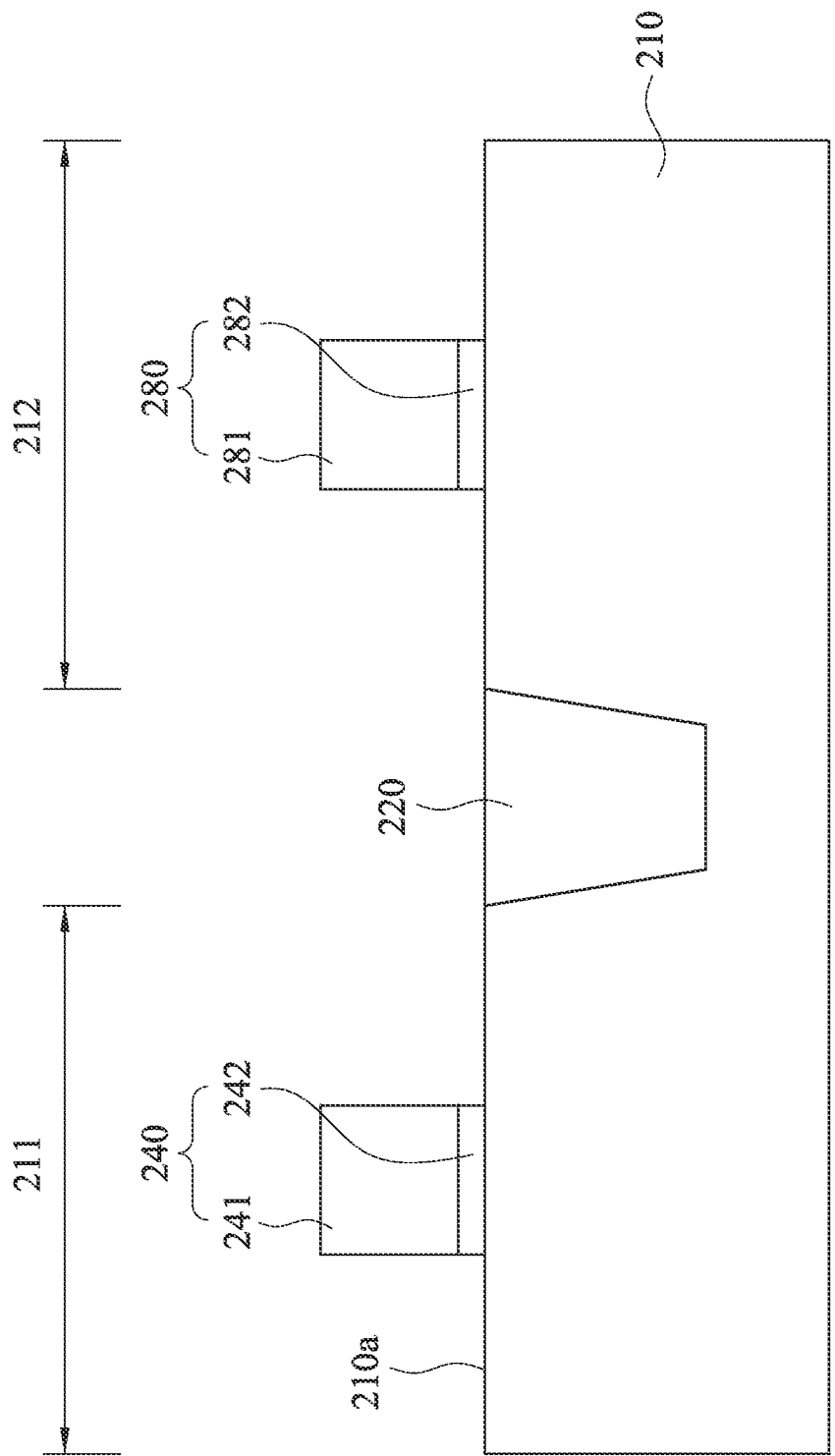

As shown in FIG. 2C, a transistor gate 240 and a gate structure 280 are respectively formed on the pixel region 211 and the periphery region 212. In some embodiments, the transistor gate 240 includes a poly-silicon gate 241 and a dielectric layer 242, and the gate structure 280 may also include for a poly-silicon gate 281 and a dielectric layer 282. Therefore, the poly-silicon gates 241 and 281 may be formed in the same operation, and it is similar to the operation of forming the dielectric layers 242 and 282. In some embodiments, the dielectric layers 242 and 282, such as silicon dioxide, are thermally grown to a thickness between about 10 Å to about 150 Å. The poly-silicon gates 241 and 281 are next deposited via LPCVD process, procedures to a thickness in a range from about 1000 Å to about 3000 Å. The poly-silicon gates 241 and 281 can be doped in situ, during deposition, via the addition of arsine, or phosphine, to a silane ambient, or the poly-silicon gates 241 and 281 can be deposited intrinsically, and subsequently doped via implantation of arsenic or phosphorous ions.

Figure 2D:
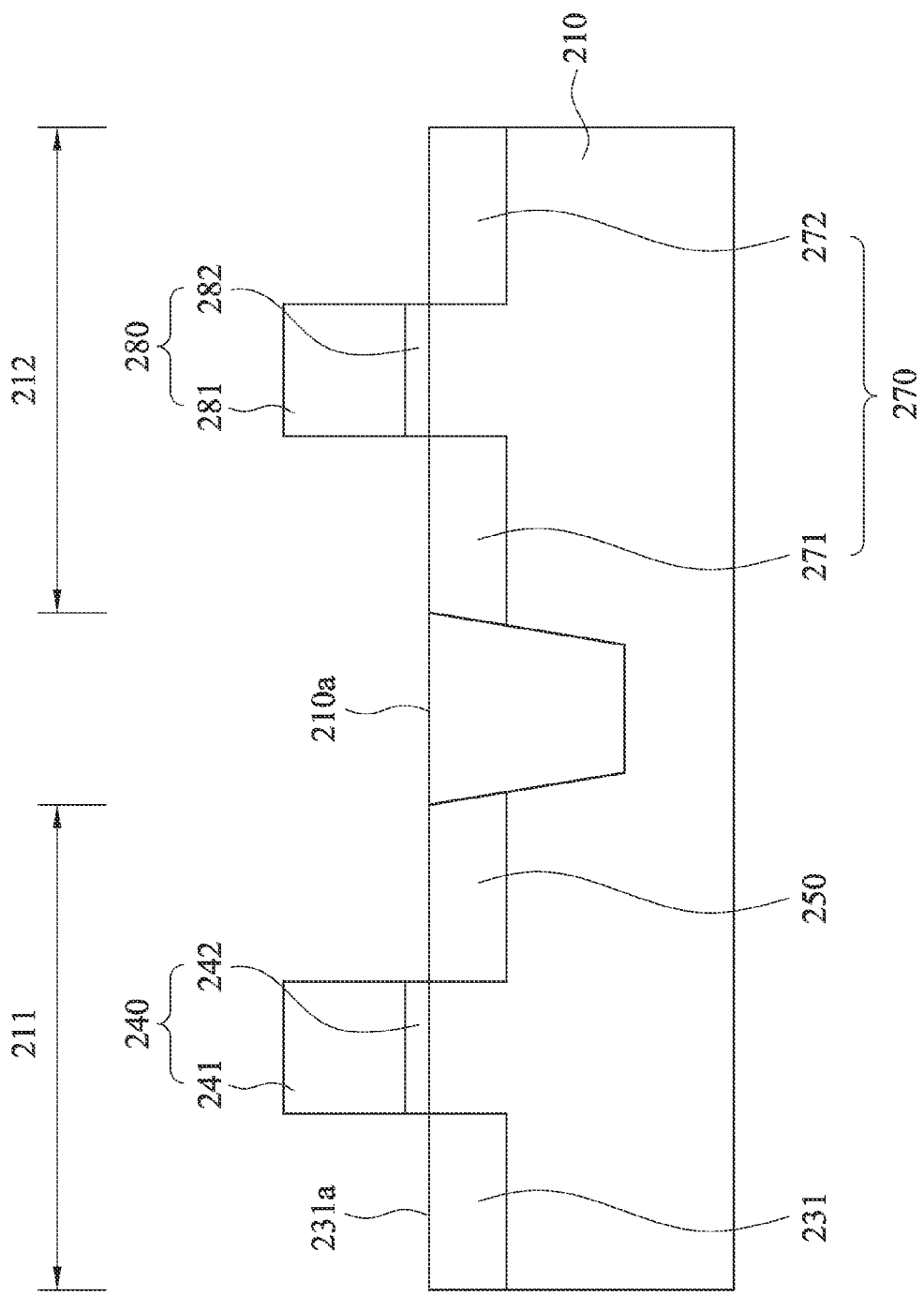

As shown in FIG. 2D, first-type ions are doped into the pixel region 211 and the periphery region 212 to form a first-type PPD 231 and a first-type drain region 250 in the pixel region 111, and to form a first-type source/drain region 270 in the periphery region 212, in which the first-type source/drain region 270 includes a first-type source region 271 and a first-type drain region 272. The transistor gate 240 is between the first-type PPD 231 and the first-type drain region 250, and the gate structure 280 is between the first-type source/drain region 270. Further, the first-type PPD 231 has a first-type PPD surface 231a coplanar with the top surface 210a. In some embodiments, second-type ions may be doped into the periphery region 212 to form a second-type source/drain region.

Figure 2E:
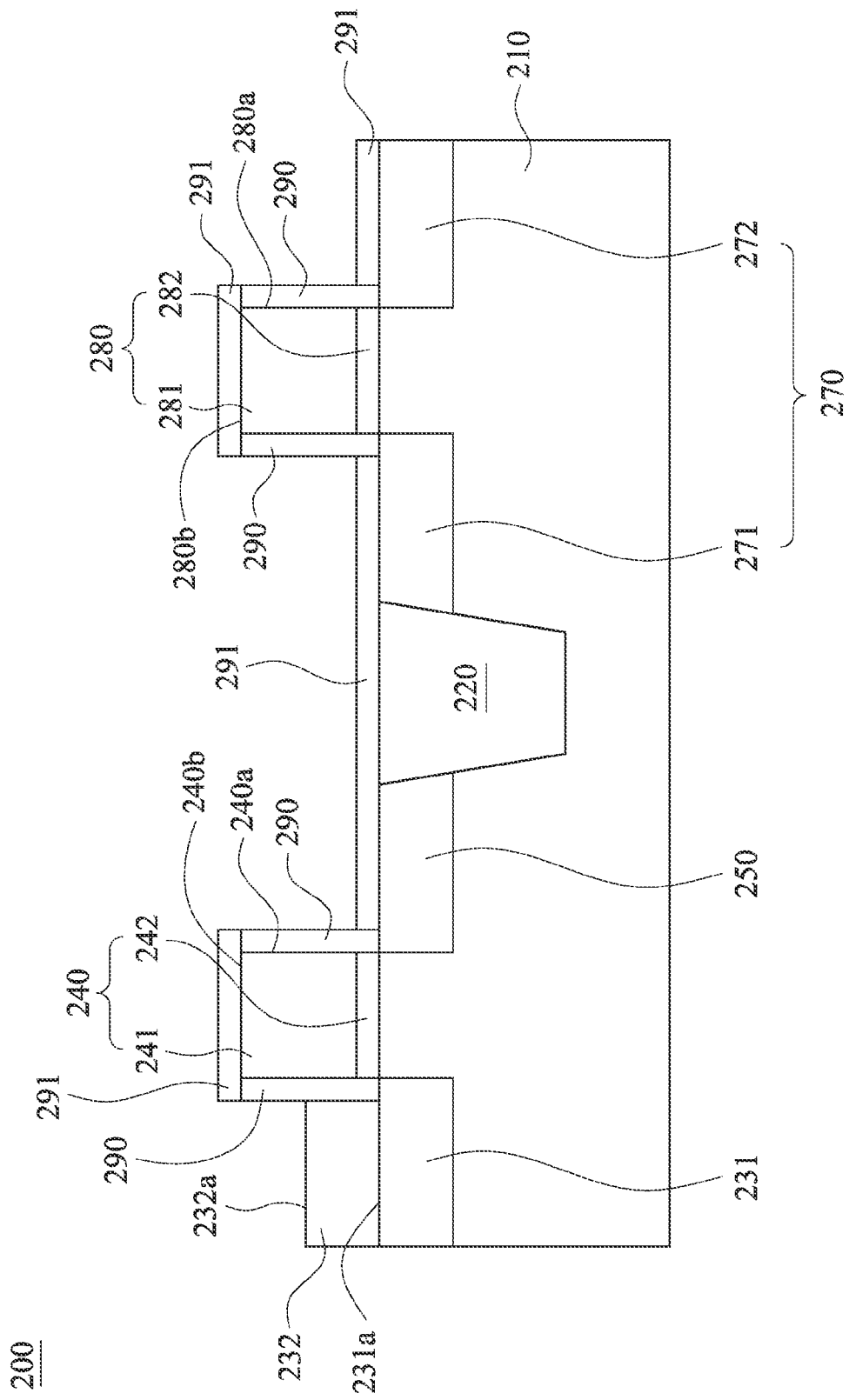

As shown in FIG. 2E, a second-type PPD 232 is formed on the first-type PPD surface 231a, in which the second-type PPD 232 has a second-type PPD surface 232a which is elevated higher than the first-type PPD surface 231a. In some embodiments, the second-type PPD 232 is formed using a SEG and in-situ doping process, thereby preventing a surface of the pixel region 211 (or the second-type PPD 232) of the semiconductor substrate 210 from being damaged by ion implantation.

Figure 3A:
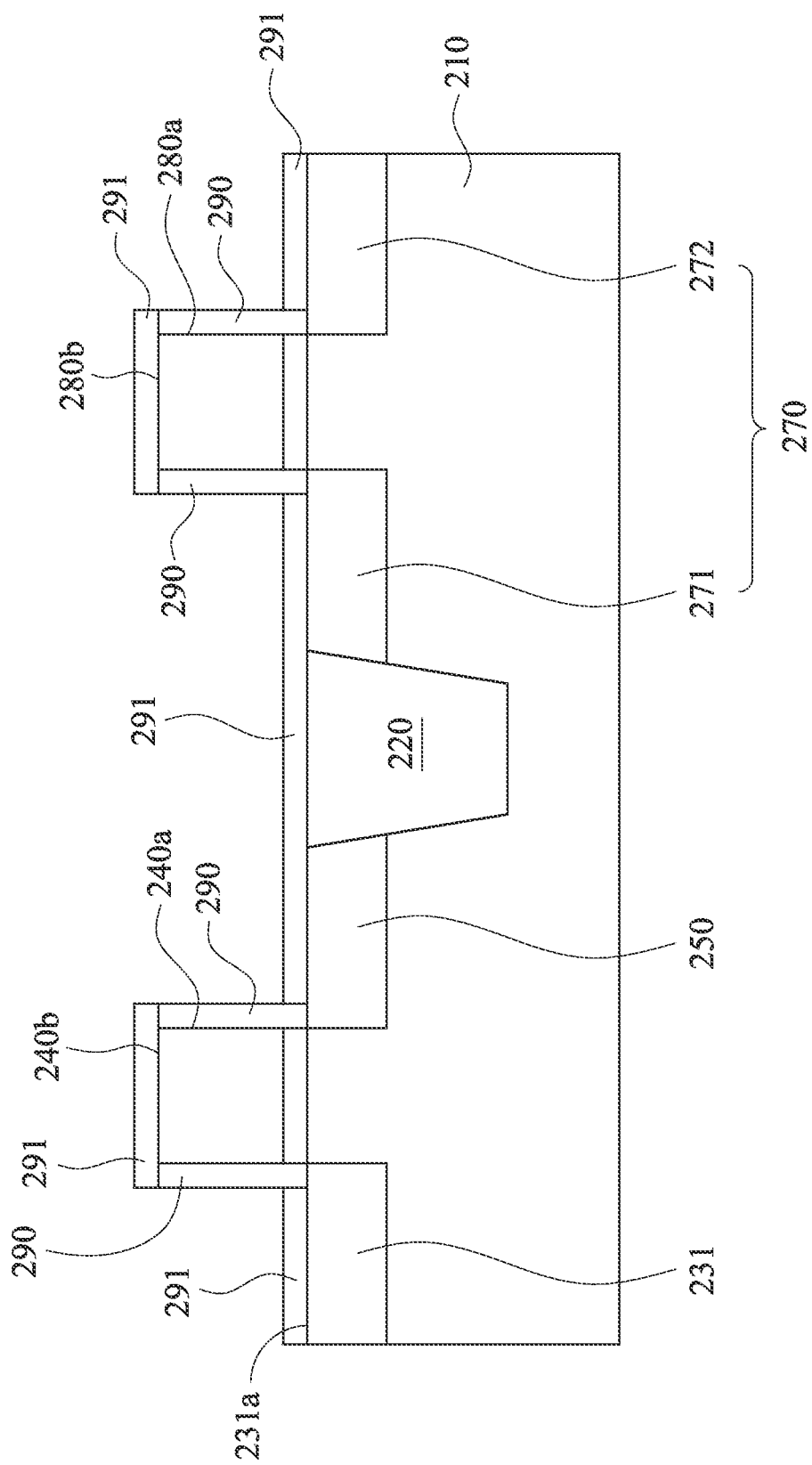
FIG. 3A and FIG. 3B are schematic cross-sectional views of intermediate stages showing forming a second-type PPD in FIG. 2E in accordance with some embodiments.
Figure 3B:
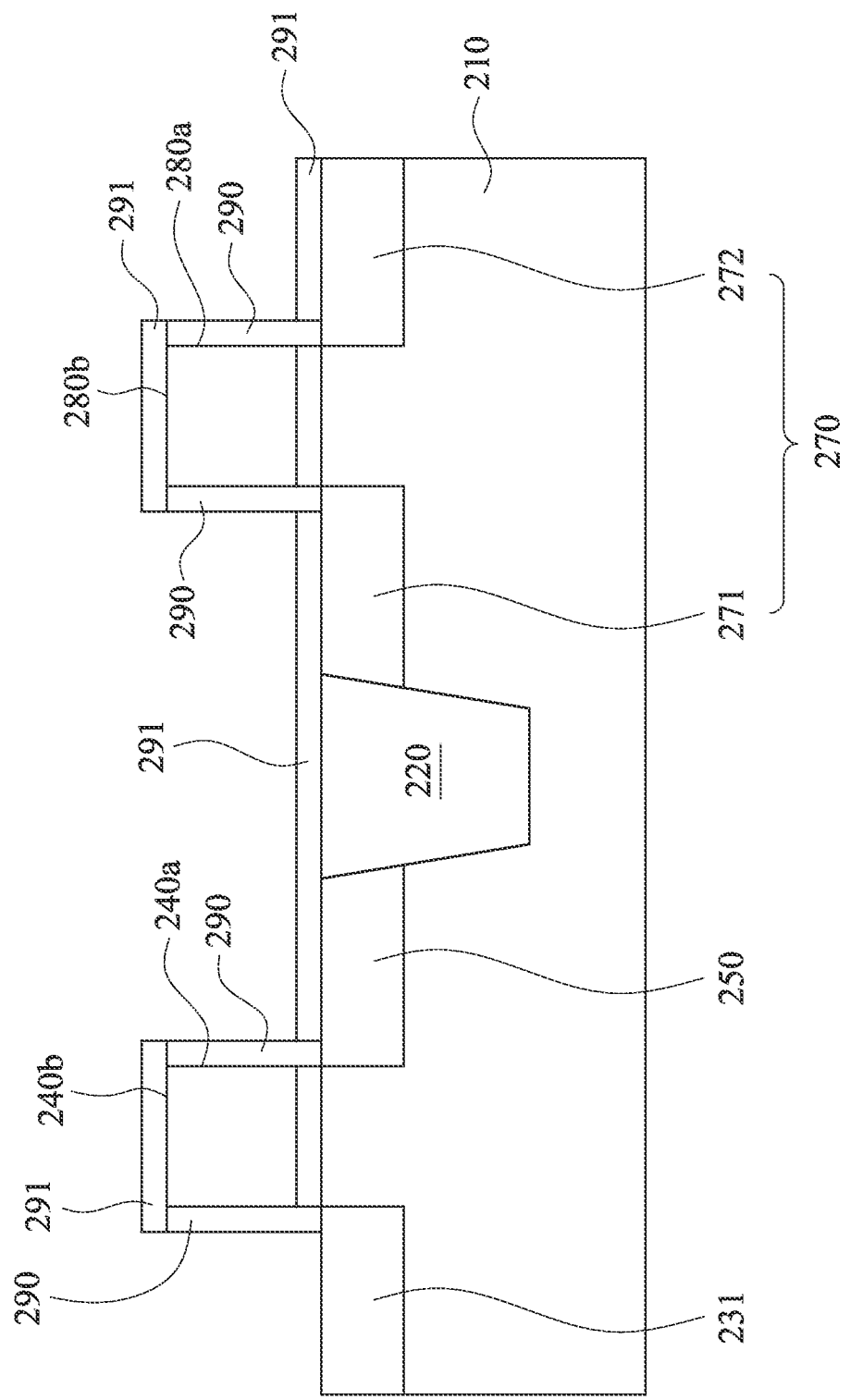

In some embodiments, a spacer 290 may be formed on a sidewall 240a of the transistor gate 240 and on a sidewall 280a of the gate structure 280 before forming the second-type PPD 232. In some embodiments, the spacer 290 may be formed on the sidewalls 240a and 280a by using a LPCVD process and a PECVD process. FIG. 3A and FIG. 3B are schematic cross-sectional views of intermediate stages showing forming a second-type PPD 232 in FIG. 2E in accordance with some embodiments. As shown in FIG. 3A, in general, a protective oxide (such as a silicon dioxide layer 291) may also be formed together with the spacer 290, in which the silicon dioxide layer 291 is formed on the semiconductor substrate 210, on a top surface 240b of the transistor gate 240 and on a top surface 280b of the gate structure 280. For the purpose of forming the second-type PPD 232, the silicon dioxide layer 291 on the second-type PPD 232 is removed using a selective etching process, as shown in FIG. 3B. Then, the second-type PPD 232 is formed on the first-type PPD 231 as shown in FIG. 2E.

It is noted that, the second-type PPD 232 is formed on the first-type PPD 231 instead of being embedded therein, such that the thickness of the second-type PPD 232 is not limited to that of the first-type PPD 231, thus improving the DC or WP performance. Further, as mentioned in the above description, electrons (which are transformed from photons) transferred from the first-type PPD 231 through transfer gate 240 to drain 250 are not blocked by the second-type PPD 232, therefore the lag performance is improved. In some embodiments, the thickness of the second-type PPD 232 is in a range from about 10 nm to about 200 nm, or about 30 nm to about 50 nm.

Figure 2F:
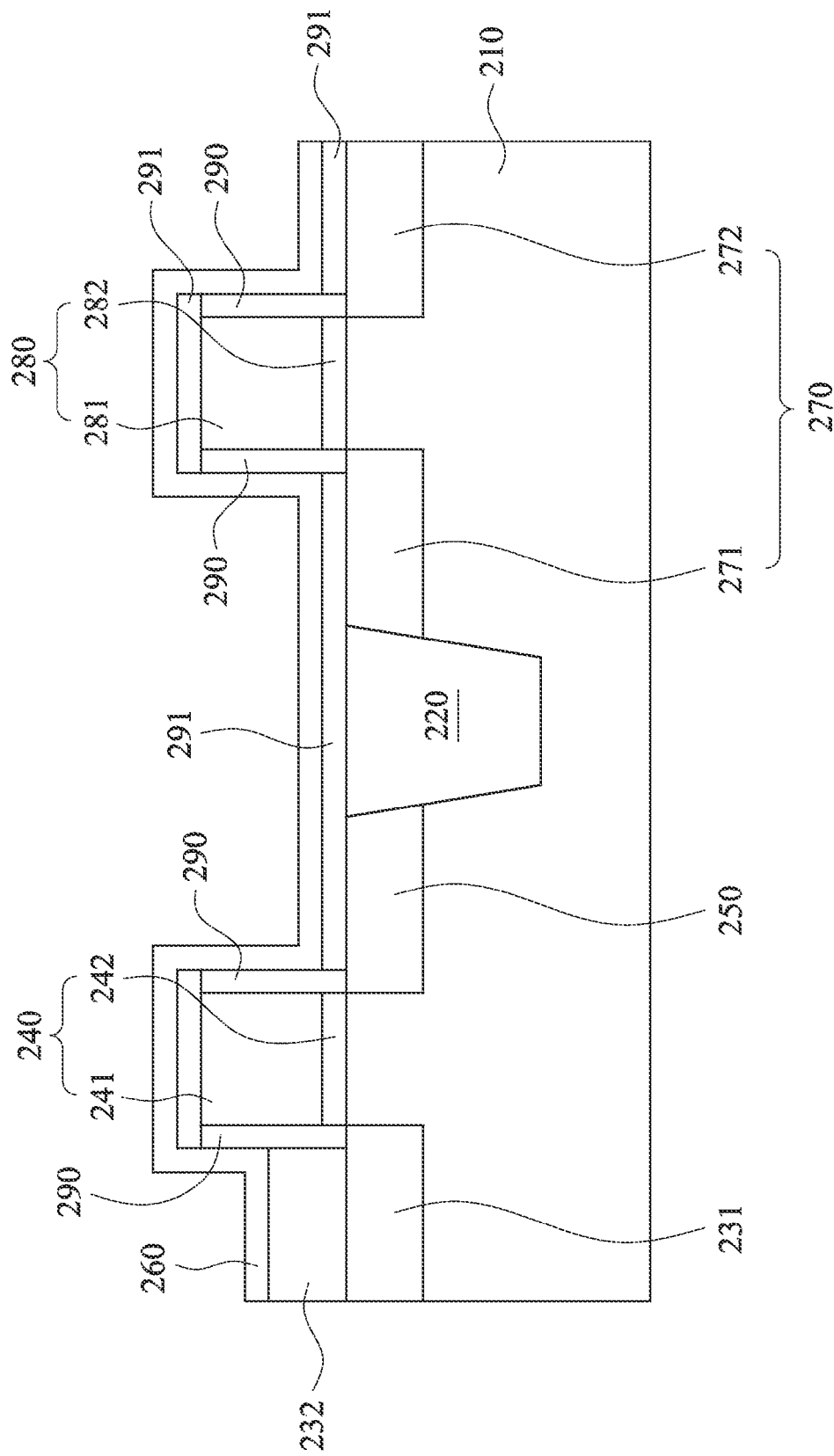

As shown in FIG. 2F, the second-type PPD 232 is protected by a protective oxide 260 formed thereon, in which the protective oxide has a thickness in a range about 1 nm to about 100 nm. The protective oxide 260 may be formed by using a rapid process oxidation process, a low pressure chemical vapor deposition (LPCVD) process or a plasma enhanced chemical vapor deposition (PECVD) process. In some embodiments, the protective oxide 260 may be formed on the second-type PPD 232 and conformal to the spacer 290 and the silicon dioxide layer 291.

Figure 2G:
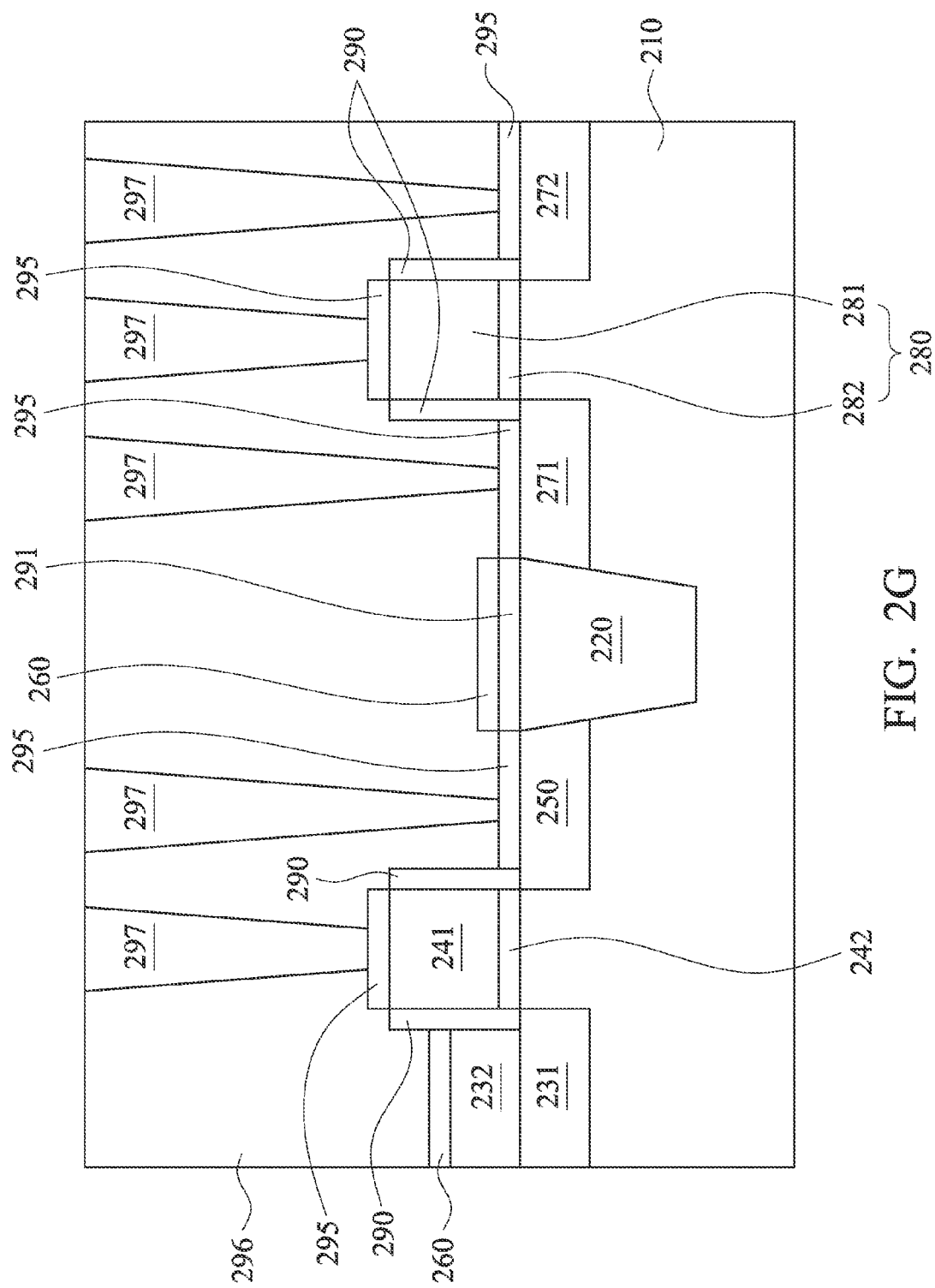

As shown in FIG. 2G, various processes may be performed on the image sensor device 200 of the present disclosure after the operation of forming the second-type PPD 232. For example, some of the various processes may include removing a portion of the silicon dioxide layer 291 and a portion of the protective oxide 260 for forming silicide structures 295 on the transistor gate 240, the gate structure 280, the first-type drain region 250 and the first-type source/drain region 270. In some embodiments, an inter layer dielectric (ILD) 296 is formed on and covers the image sensor device 200 of the present disclosure, and then contact structures 297 (such as formed from tungsten, aluminum or copper) are passing through the ILD 296, such that being electrically connected to the transistor gate 240, the gate structure 280, the first-type drain region 250 and the first-type source/drain region 270, respectively. In some embodiments, a chemical mechanical polishing (CMP) process may also be used in the various processes.

In some embodiments, the semiconductor substrate 210 is a p-type substrate, and the first-type and the second-type may be n-type and p-type respectively. In alternative embodiments, the first-type and the second-type may be p-type and n-type respectively.

Figure 4A:
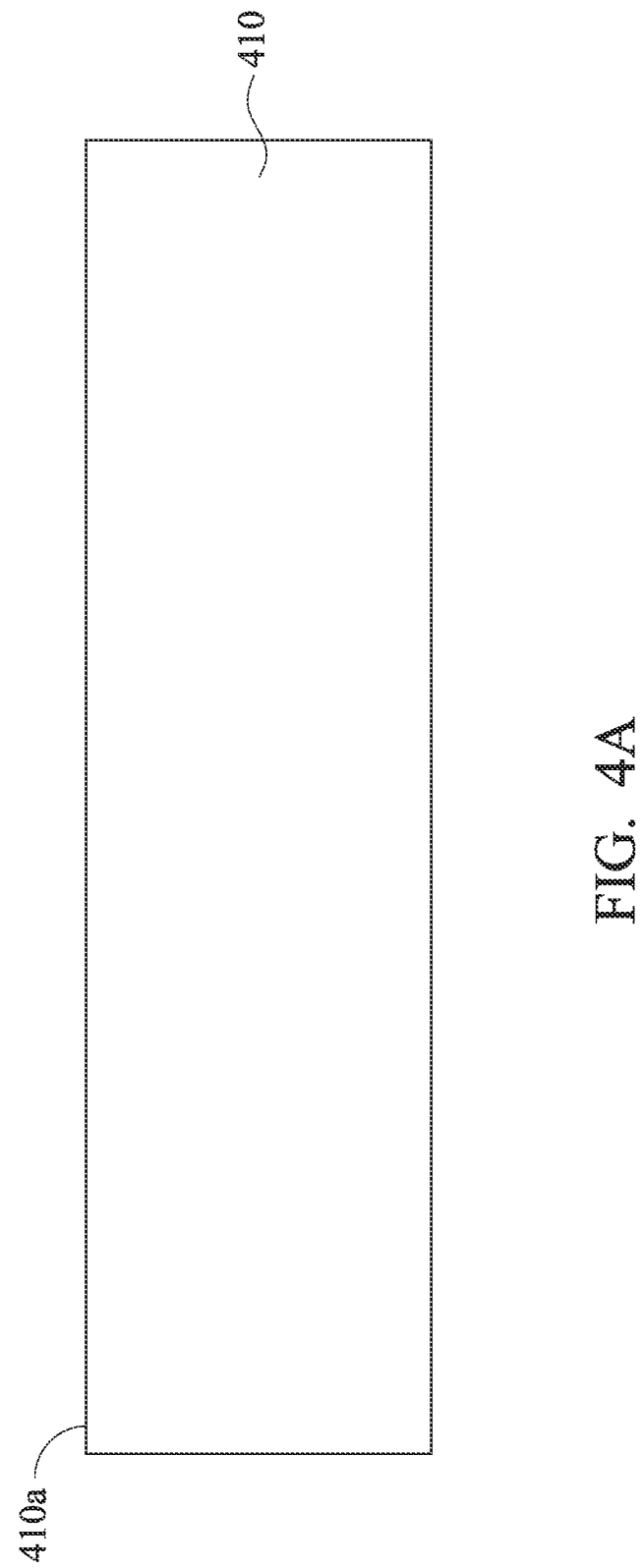
FIG. 4A-4J are schematic cross-sectional views of intermediate stages showing a method for fabricating an image sensor device 400 in accordance with certain embodiments.

FIG. 4A-4J are schematic cross-sectional views of intermediate stages showing a method for fabricating an image sensor device 400 in accordance with certain embodiments. As shown in FIG. 4A, a semiconductor substrate 410 with a top surface 410a is provided. In some embodiments, the semiconductor substrate 410 is formed from such as silicon. Other commonly used materials, such as carbon, germanium, silicon-germanium, gallium, arsenic, nitrogen, indium, phosphorus, and/or the like, may also be included in the semiconductor substrate. The semiconductor substrate 410 may be formed from a single-crystalline semiconductor material or compound semiconductor materials, and may be a bulk substrate or a SOI substrate.

Figure 4B:
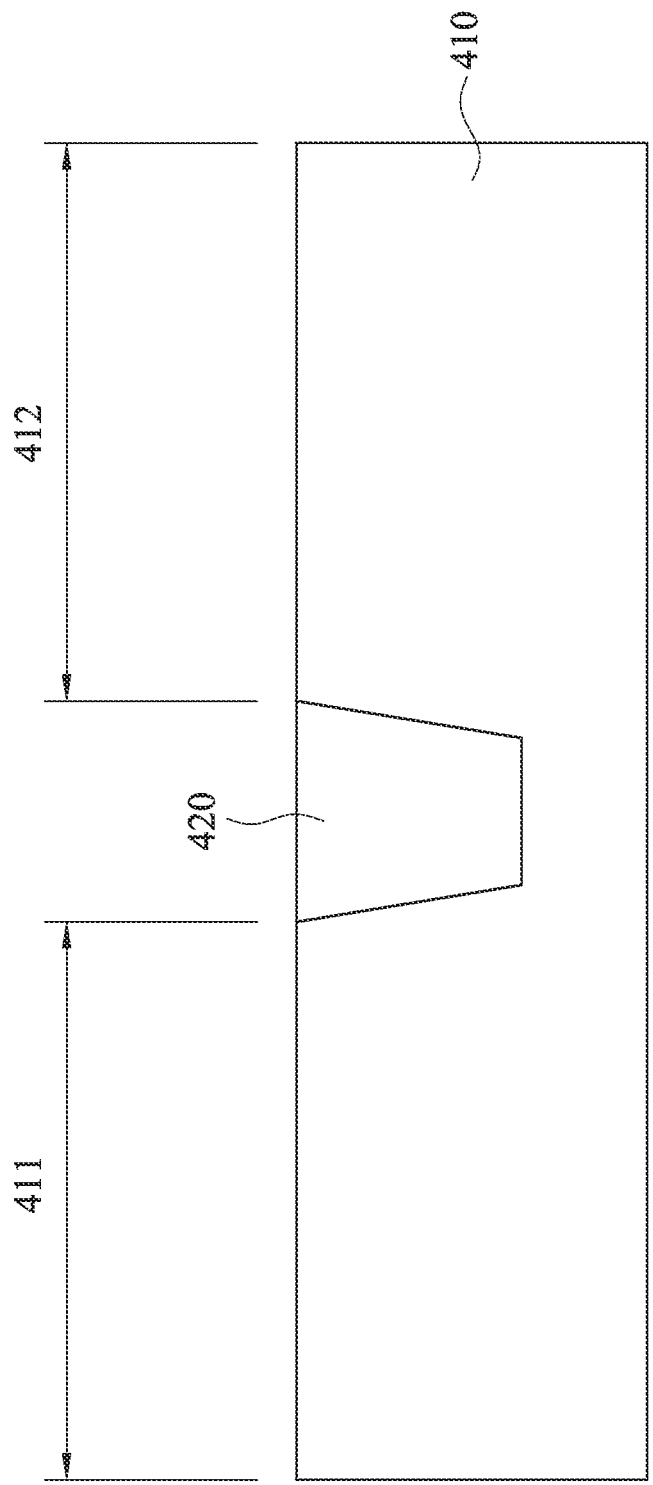

As shown in FIG. 4B, an isolation feature 420 is disposed in the top surface 410a to define a pixel region 411 and a periphery region 412 of the semiconductor substrate 410. In some embodiments, some isolation features 420 may be shallow trench isolations (STIs) used to separate and isolate photo diodes, memory cells or SRAM cells in an array area, and some isolation features 420 are deep trench isolations used to separate and isolate NMOS and PMOS devices in a peripheral area. The structures, materials, depth of the STI and the deep or shallow trench isolation can be different in different area. Specific STI profile and material may be needed for meeting certain device requirements.

Figure 4C:
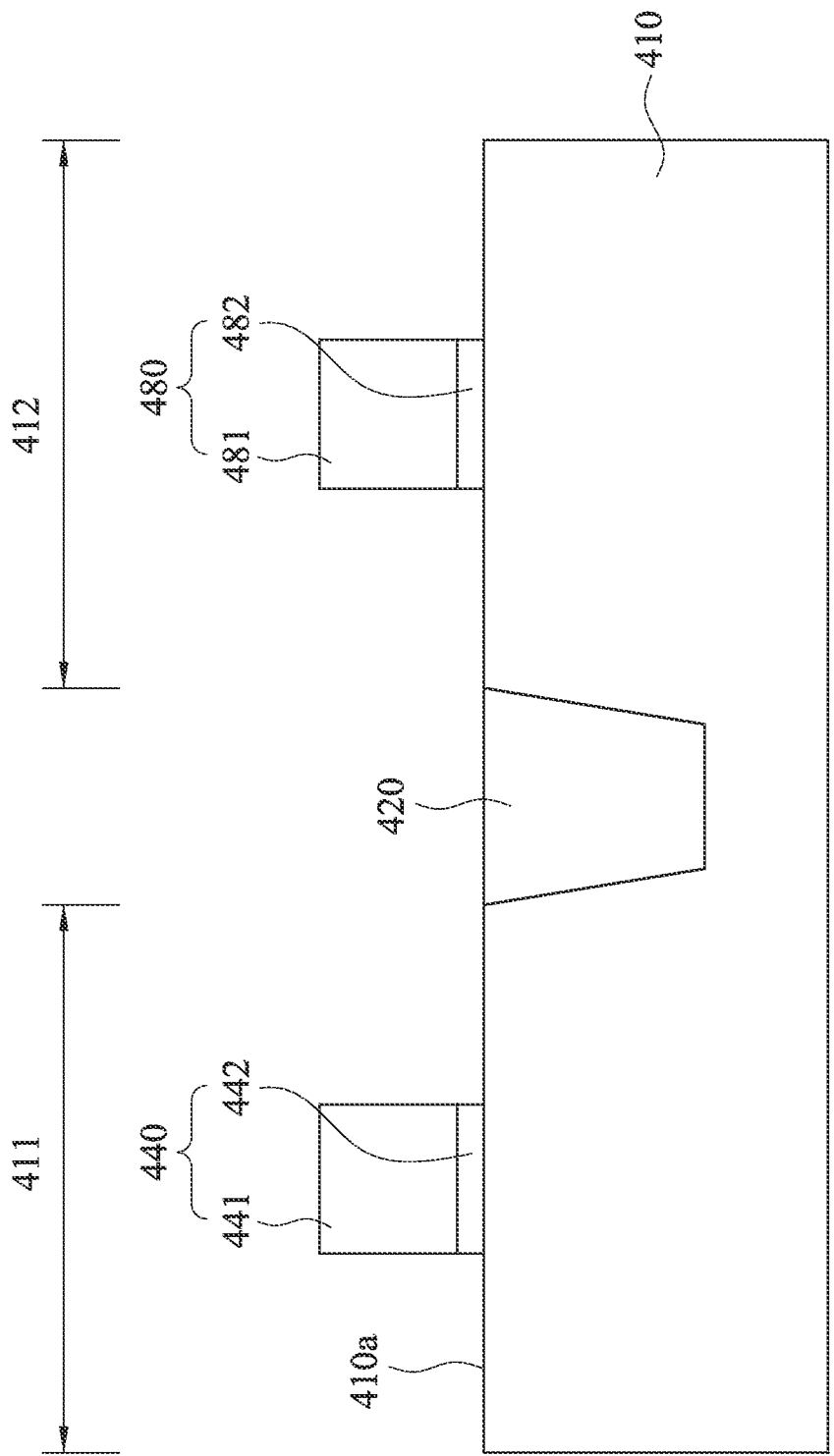

As shown in FIG. 4C, a transistor gate 440 and a gate structure 480 are respectively formed on the pixel region 411 and the periphery region 412. In some embodiments, the transistor gate 440 includes a poly-silicon gate 441 and a dielectric layer 442, and the gate structure 480 may also include for a poly-silicon gate 481 and a dielectric layer 482. Therefore, the poly-silicon gates 441 and 481 may be formed in the same operation, and it is similar to the operation of forming the dielectric layers 442 and 482. In some embodiments, the dielectric layers 442 and 482, such as silicon dioxide, are thermally grown to a thickness between about 10 Å to about 150 Å. The poly-silicon gates 441 and 481 are next deposited via LPCVD process, procedures to a thickness in a range from about 1000 Å to about 3000 Å. The poly-silicon gates 441 and 481 can be doped in situ, during deposition, via the addition of arsine, or phosphine, to a silane ambient, or the poly-silicon gates 441 and 481 can be deposited intrinsically, and subsequently doped via implantation of arsenic or phosphorous ions.

Figure 4D:
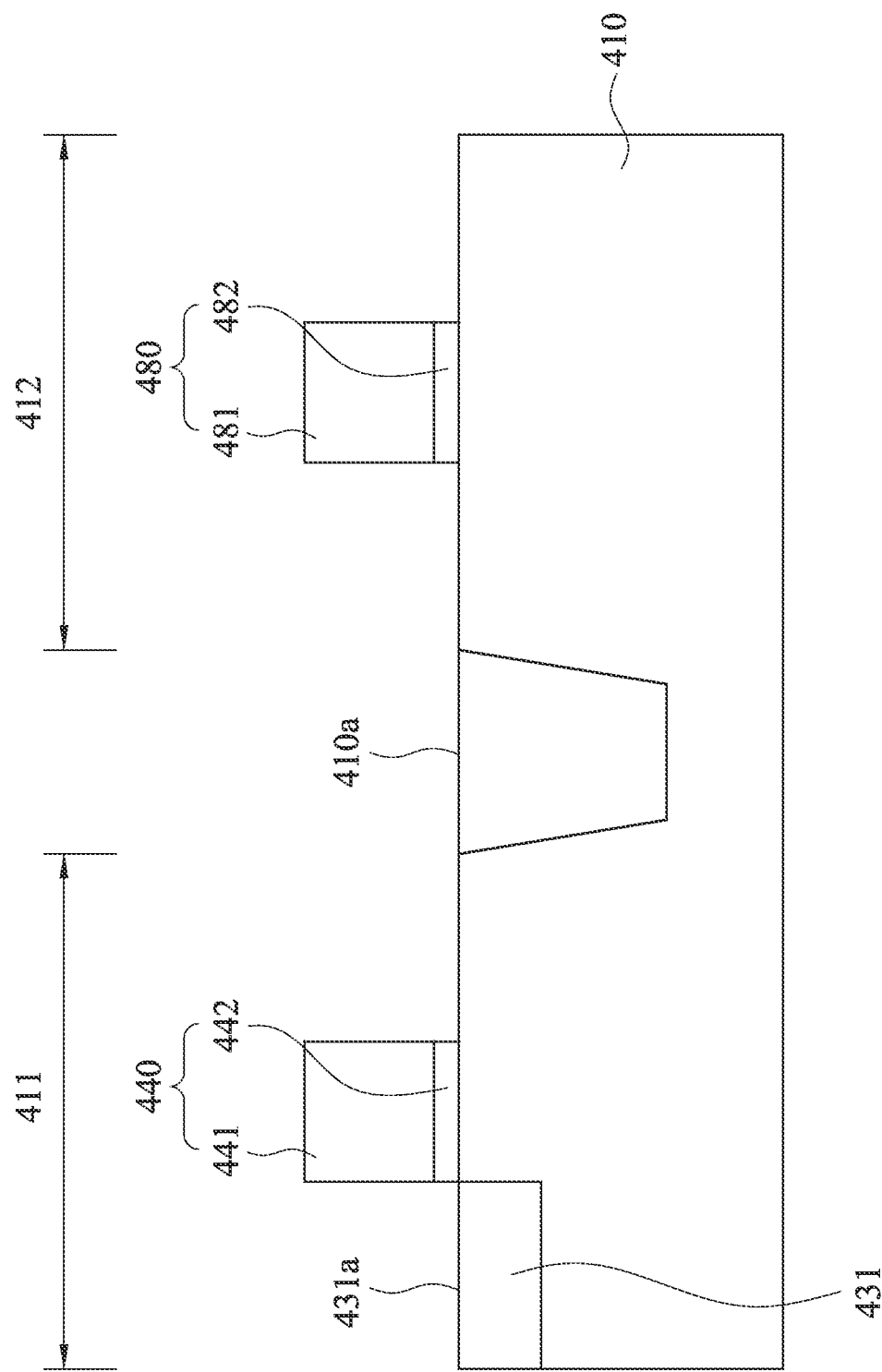

As shown in FIG. 4D, first-type ions are doped into the pixel region 411. The first-type PPD 431 has a first-type PPD surface 431a coplanar with the top surface 410a.

Figure 4E:
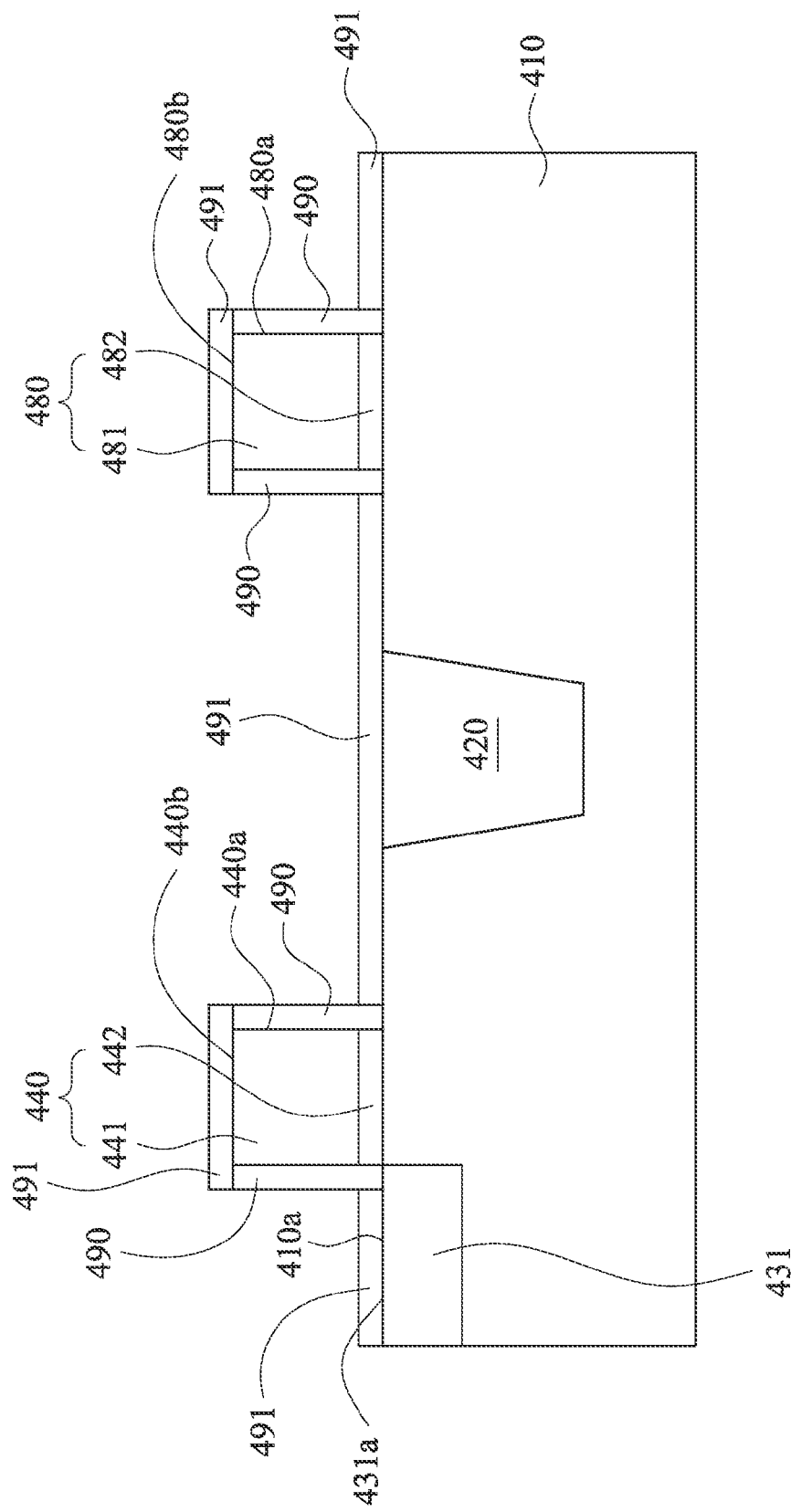

As shown in FIG. 4E, a spacer 490 is formed on a sidewall 440a of the transistor gate 440 and on a sidewall 480a of the gate structure 480. A protective oxide (such as a silicon dioxide layer 491) is also formed together with the spacer 490, in which the silicon dioxide layer 491 is formed on the semiconductor substrate 410, on a top surface 440b of the transistor gate 440 and on a top surface 480b of the gate structure 480. In some embodiments, the spacer 490 may be formed on the sidewalls 440a and 480a by using a LPCVD process and a PECVD process.

Figure 4F:
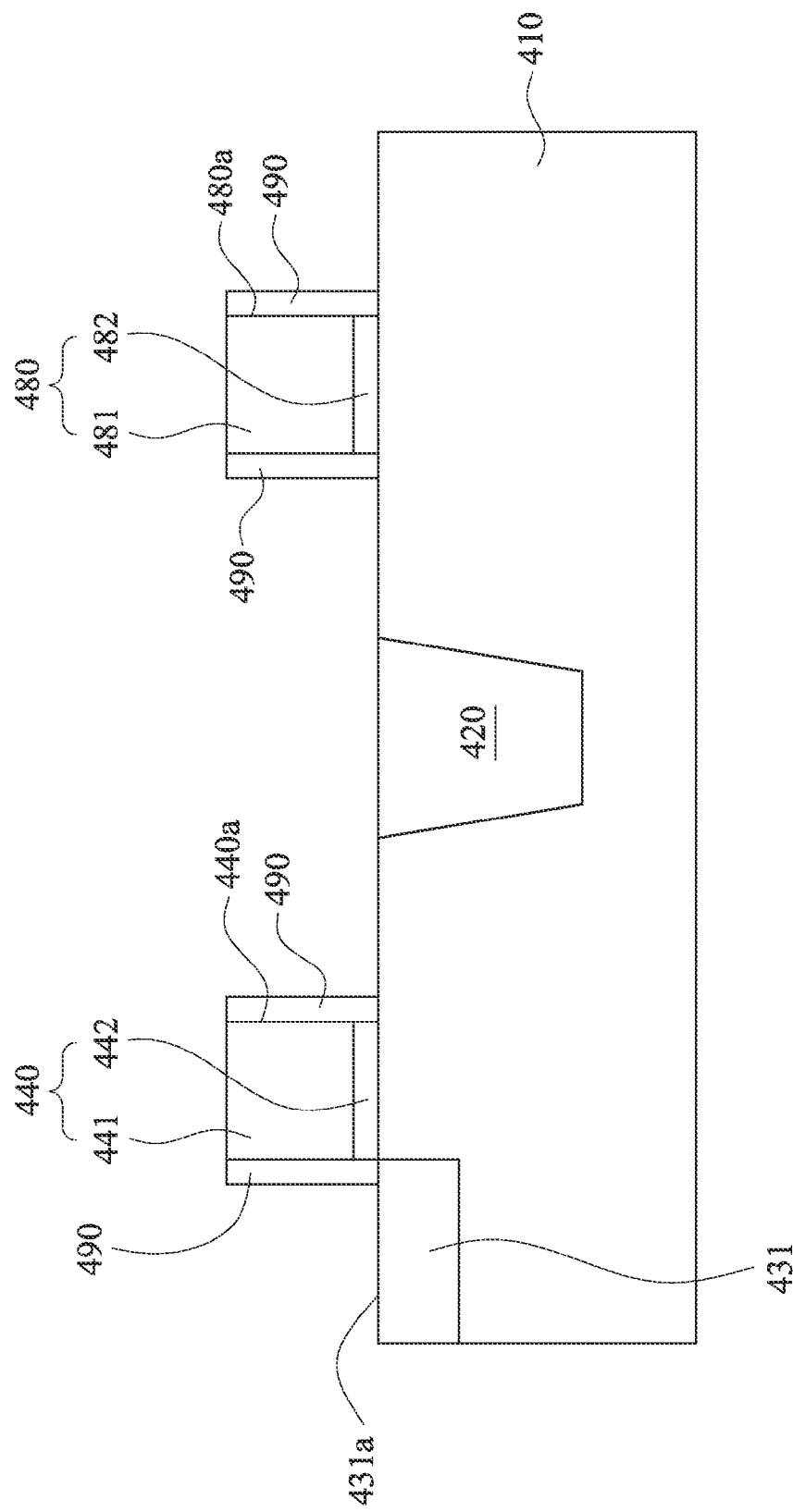

As shown in FIG. 4F, the silicon dioxide layer 491 is totally removed using an etching process. In general, the spacer 490 has a thicker thickness than the silicon dioxide layer 491, therefore the spacer 490 is retained on the sidewalls 440a and 480a. In some embodiments, a silicon nitride layer may be formed on the spacer 490 as a mask for protecting the spacer 490 from being removed when the silicon dioxide layer 491 is totally removed using the etching process.

Figure 4G:
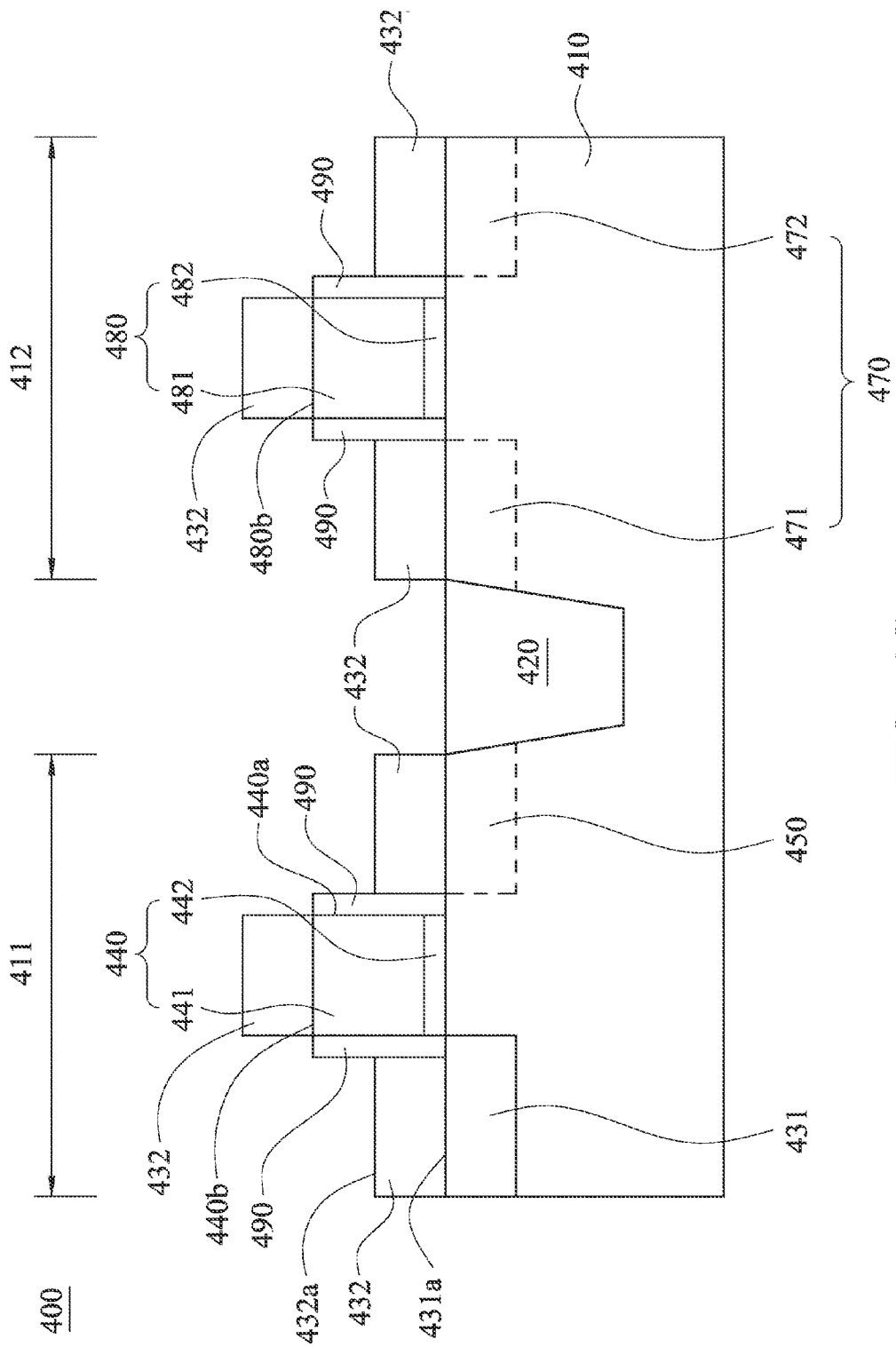

As shown in FIG. 4G, a second-type PPD 432 is formed in the pixel region 411 and the periphery region 412. In detail, a portion of the second-type PPD 432 is formed on the first-type PPD surface 431a, in which the portion of the second-type PPD 432 has a second-type PPD surface 432a which is elevated higher than the first-type PPD surface 431a. The remaining portion of the second-type PPD 432 is not only formed on a top surface 440b of the transistor gate 440 and on a top surface 480b of the gate structure 480, but also formed on a first-type drain region 450 and a first-type source/drain region 470, in which the first-type drain region 450 and the first-type source/drain region 470 are formed in sequential operations. In some embodiments, the second-type PPD 432 is formed using an SEG and in-situ doping process, thereby preventing a surface of the pixel region 411 (or the second-type PPD 432) of the semiconductor substrate 410 from being damaged by ion implantation.

Figure 4H:
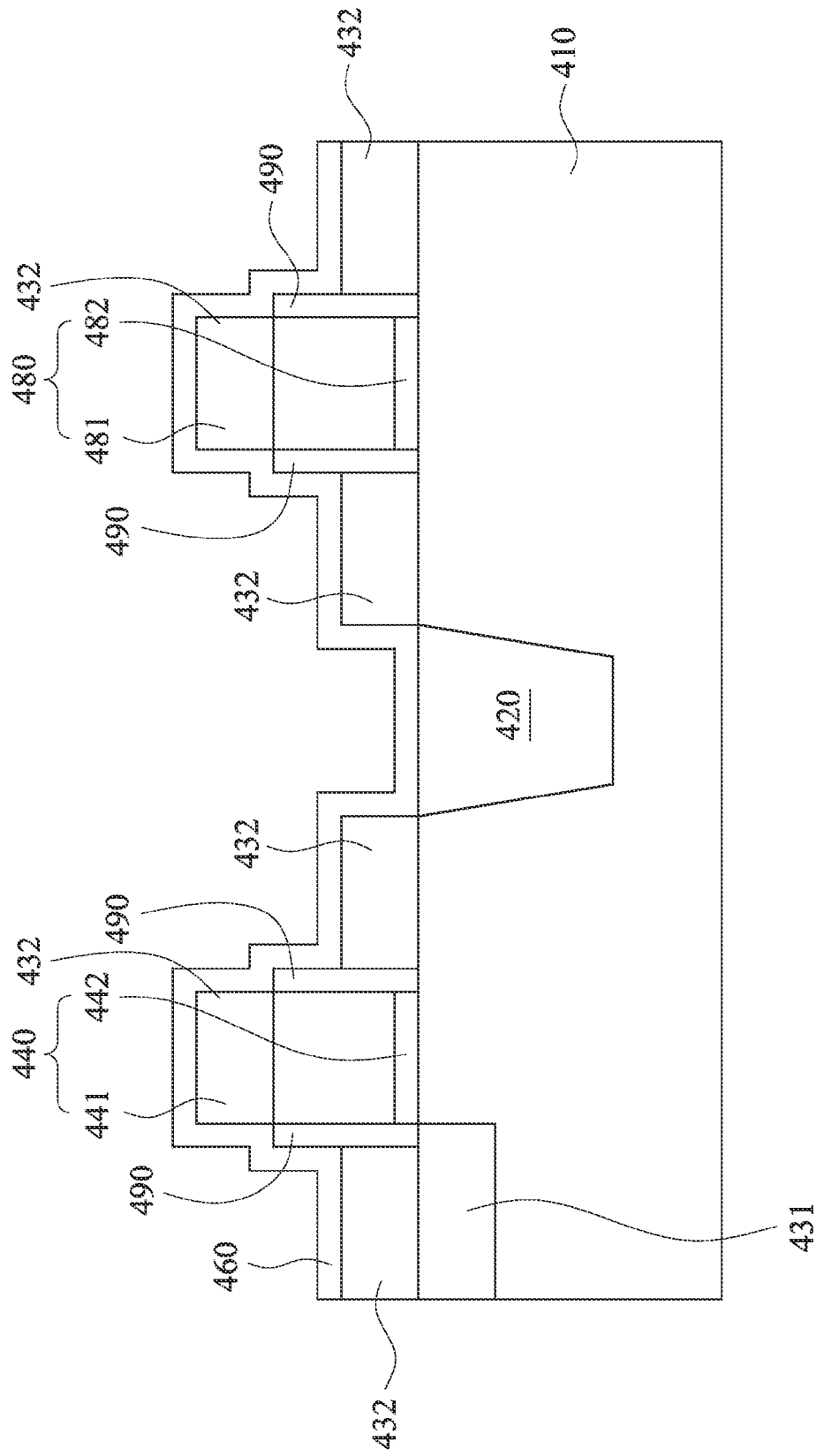

As shown in FIG. 4H, the second-type PPD 432 is protected by a protective oxide 460 formed thereon, in which the protective oxide 460 has a thickness in a range about 1 nm to about 100 nm. The protective oxide 460 may be formed by using a rapid process oxidation process, a low pressure chemical vapor deposition (LPCVD) process or a plasma enhanced chemical vapor deposition (PECVD) process. In some embodiments, the protective oxide 460 may be formed on the second-type PPD 432 and conformal to the spacer 490.

Figure 4I:
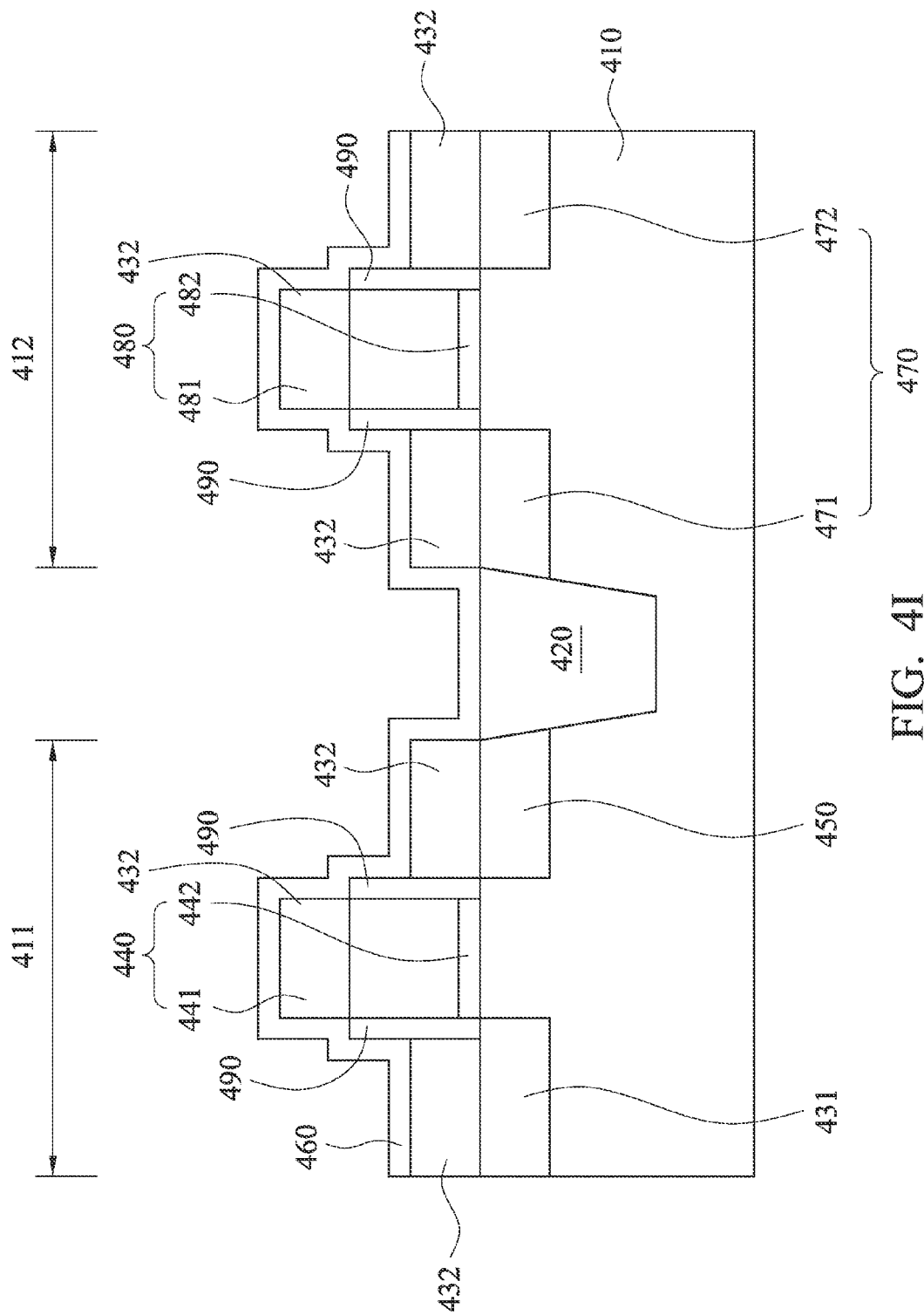

As shown in FIG. 4I, first-type ions are doped into the pixel region 411 and the periphery region 412 to form the first-type drain region 450 in the pixel region 411, and to form the first-type source/drain region 470 in the periphery region 412, in which the first-type source/drain region 470 includes a first-type source region 471 and a first-type drain region 472. The transistor gate 440 is between the first-type PPD 431 and the first-type drain region 450, and the gate structure 480 is between the first-type source/drain region 470. In some embodiments, the first-type source/drain region 470 and the first-type drain region 450 of the image sensor device 400 may have higher doping concentrations than those of the image sensor device 400, thereby the influence induced by the second-type PPD 432 thereon is negligible. In some embodiments, second-type ions may be doped into the periphery region 412 to form a second-type source/drain region.

Figure 4J:
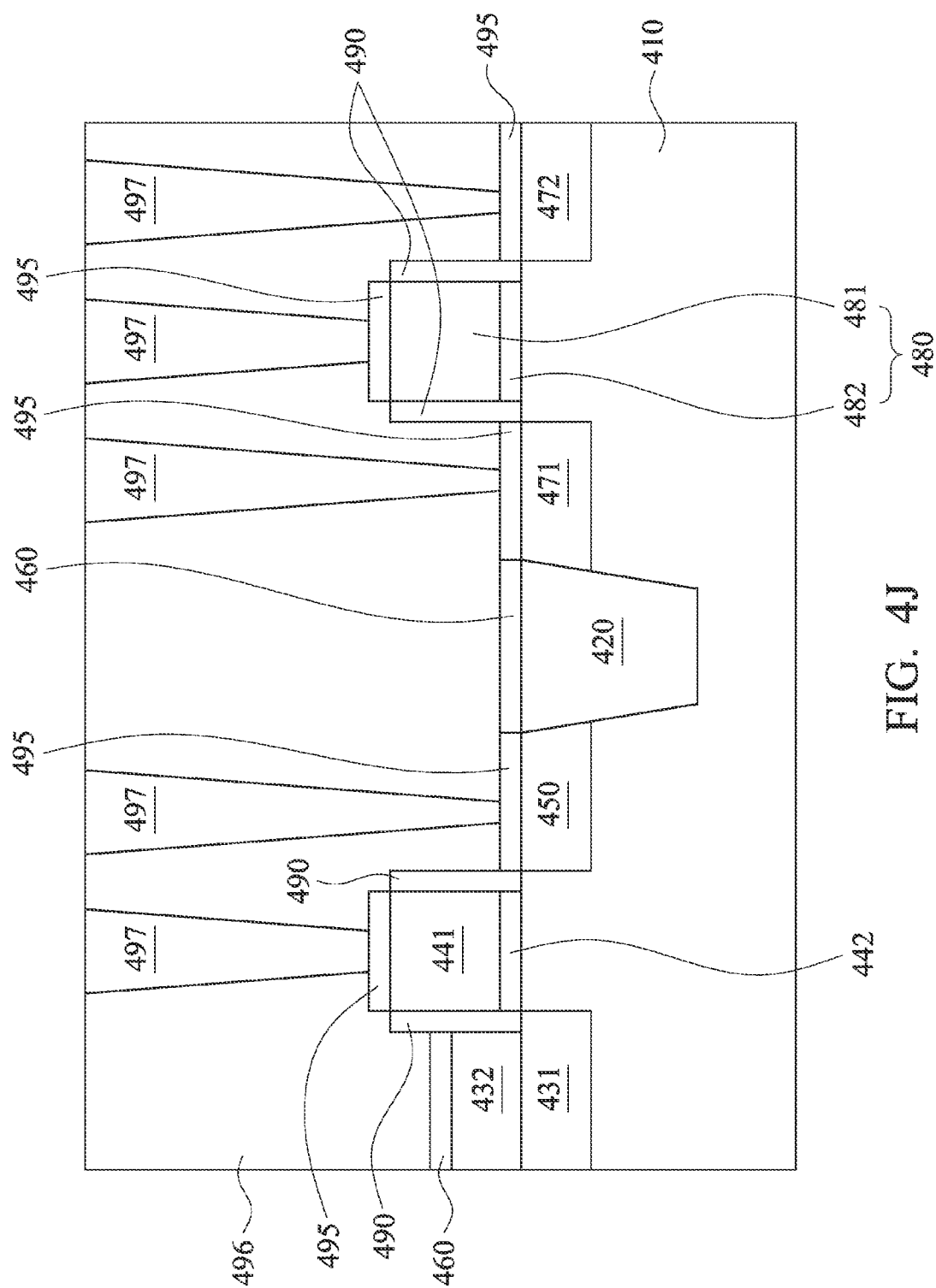

As shown in FIG. 4J, various processes may be performed on the image sensor device 400 of the present disclosure after the operation of forming the first-type drain region 450 and the first-type source/drain region 470. For example, some of the various processes may include removing a portion of the second-type PPD 432 and a portion of the protective oxide 460 for forming silicide structures 495 on the transistor gate 440, the gate structure 480, the first-type drain region 450 and the first-type source/drain region 470. In some embodiments, an inter layer dielectric (ILD) 496 is formed on and covers the image sensor device 400 of the present disclosure, and then contact structures 497 (such as formed from tungsten, aluminum or copper) are passing through the ILD 496, such that being electrically connected to the transistor gate 440, the gate structure 480, the first-type drain region 450 and the first-type source/drain region 470, respectively. In some embodiments, a chemical mechanical polishing (CMP) process may also be used in the various processes.

Figure 5:
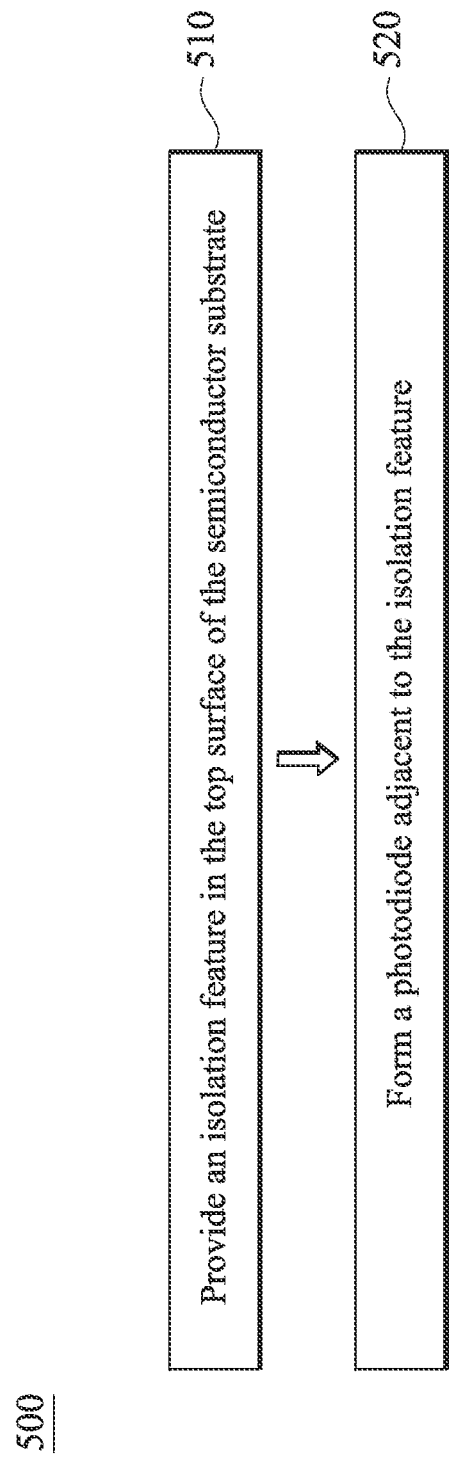
FIG. 5 is a flow chart of a method for fabricating an active pixel cell in accordance with various embodiments.

Referring to FIG. 5 together with FIG. 1A-FIG. 1B, FIG. 5 is a flow chart of a method 500 for fabricating a semiconductor device in accordance with various embodiments. The method 500 begins at operation 510, where an isolation feature 120 is in a top surface 110a of a semiconductor substrate 110 is provided, as shown in FIG. 1A. At operation 520, a photodiode 130 is formed adjacent to the isolation feature 120, as shown in FIG. 1B. The photodiode 130 includes a first-type PPD 131 and a second-type PPD 132. The first-type PPD 131 has a first-type PPD surface 131a coplanar with the top surface 110a. The second-type PPD 132 is formed on the first-type PPD surface 131a, in which the second-type PPD 132 has a second-type PPD surface 132a which is elevated higher than the first-type PPD surface 131a.

Figure 6:
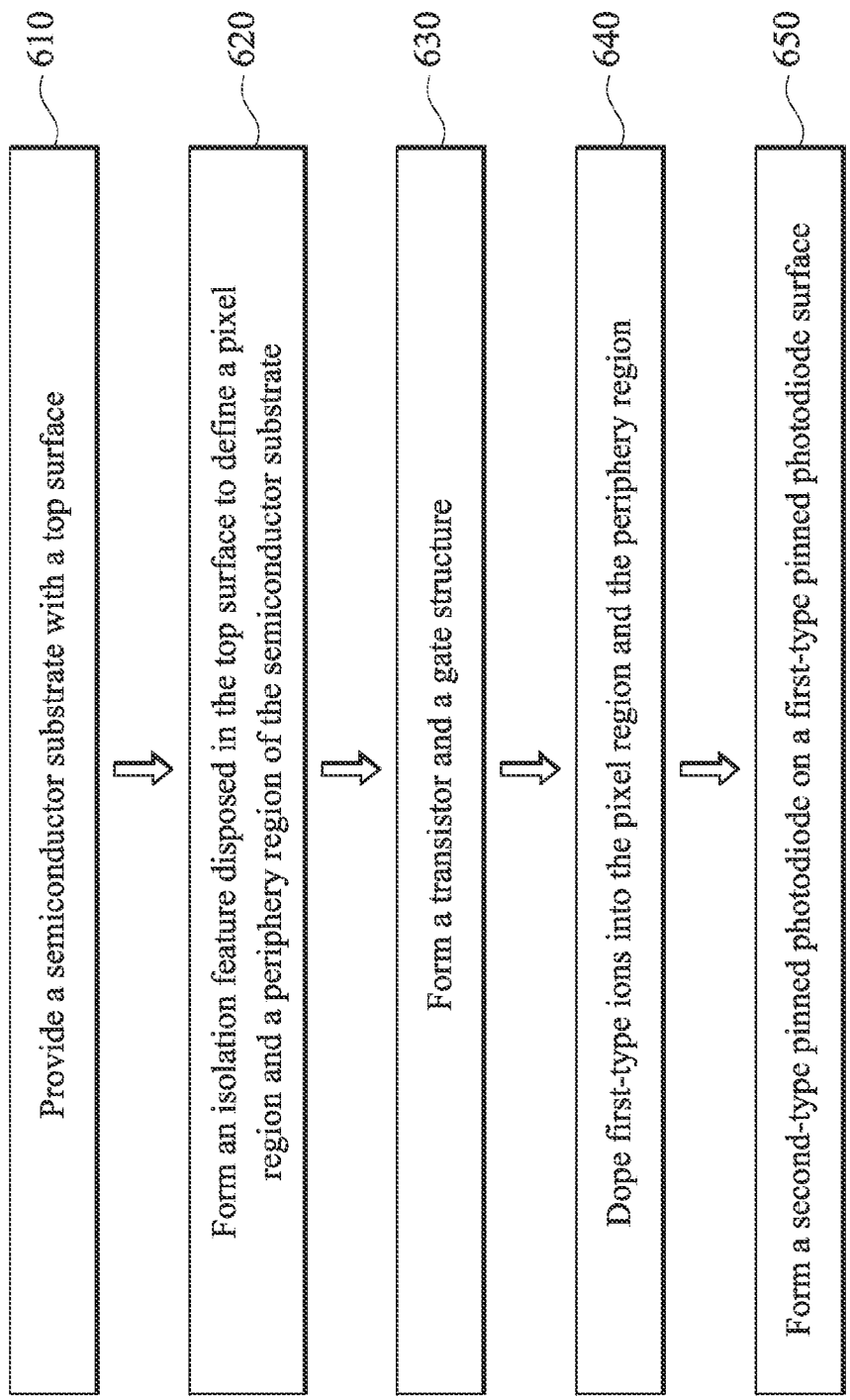
FIG. 6 is a flow chart of a method for fabricating an image sensor device in accordance with various embodiments.

Referring to FIG. 6 together with FIG. 2A-FIG. 2E, FIG. 6 is a flow chart of a method 600 for fabricating a semiconductor device in accordance with various embodiments. The method 600 begins at operation 610, where a semiconductor substrate 210 with a top surface 210a is provided, as shown in FIG. 2A. At operation 620, an isolation feature 220 disposed in the top surface 210a is formed to define a pixel region 211 and a periphery region 212 of the semiconductor substrate 210, as shown in FIG. 2B. At operation 630, a transistor gate 240 and a gate structure 280 respectively formed on the pixel region 211 and the periphery region 212, as shown in FIG. 2C. At operation 640, first-type ions are doped into the pixel region 211 and the periphery region 212 to form a first-type PPD 231 and a first-type drain region 250 in the pixel region 211, and to form a first-type source/drain region 270 in the periphery region 212, as shown in FIG. 2D. The transistor gate 240 is between the first-type PPD 231 and the first-type drain region 250. The gate structure 280 is between the first-type source/drain region 270, in which the first-type PPD has a first-type PPD surface 231a coplanar with the top surface 210a. At operation 650, a second-type PPD 232 is formed on the first-type PPD surface 231a, as shown in FIG. 2E. The second-type PPD 232 has a second-type PPD surface 232a which is elevated higher than the first-type PPD surface 231a.

In accordance with some embodiments, the present disclosure discloses an active pixel cell on a semiconductor substrate with a top surface. The active pixel cell includes an isolation feature and a photodiode. The isolation feature is in the top surface of the semiconductor substrate. The photodiode is adjacent to the isolation feature. The photodiode includes a first-type pinned photodiode (PPD) and a second-type PPD. The first-type PPD is in the pixel region, in which the first-type PPD has a first-type PPD surface coplanar with the top surface. The second-type PPD is on the first-type PPD surface, in which the second-type PPD has a second-type PPD surface which is elevated higher than the first-type PPD surface.

In accordance with certain embodiments, the present disclosure discloses a method for fabricating an active pixel cell on a semiconductor substrate with a top surface. In this method, an isolation feature in the top surface of the semiconductor substrate is provided. A photodiode adjacent to the isolation feature is formed. The photodiode includes a first-type pinned photodiode (PPD) and a second-type PPD. The first-type PPD is formed in the semiconductor substrate, in which the first-type PPD has a first-type PPD surface coplanar with the top surface. The second-type PPD is formed on the first-type PPD surface, in which the second-type PPD has a second-type PPD surface which is elevated higher than the first-type PPD surface.

In accordance with alternative embodiments, the present disclosure discloses a method for fabricating an image sensor device. In this method, a semiconductor substrate with a top surface is provided. An isolation feature disposed in the top surface is formed to define a pixel region and a periphery region of the semiconductor substrate. A transistor gate and a gate structure are respectively formed on the pixel region and the periphery region. First-type ions are doped into the pixel region and the periphery region to form a first-type PPD and a first-type drain region in the pixel region, and to form a first-type source/drain region in the periphery region, in which the transistor gate is between the first-type PPD and the first-type drain region, and the gate structure is between the first-type source/drain region, in which the first-type PPD has a first-type PPD surface coplanar with the top surface. A second-type PPD is formed on the first-type PPD surface, in which the second-type PPD has a second-type PPD surface which is elevated higher than the first-type PPD surface.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An active pixel cell on a semiconductor substrate with a top surface, the active pixel cell comprising:
    an isolation feature in the top surface of the semiconductor substrate; and
    a photodiode adjacent to the isolation feature, wherein the photodiode comprises:
        a first-type pinned photodiode (PPD) in the semiconductor substrate, wherein the first-type PPD has a first-type PPD surface coplanar with the top surface;
        a second-type PPD on the first-type PPD surface, wherein the second-type PPD has a second-type PPD surface which is elevated higher than the first-type PPD surface, and the first-type PPD is one of an n-type PPD and a p-type PPD, and the second-type PPD is the other one of the n-type PPD and the p-type PPD; and
        a protective oxide which is disposed on and covers the second-type PPD and contacts a portion of a top surface of the second-type PPD.

2. The active pixel cell of claim 1, wherein the second-type PPD is an epitaxial layer.

3. The active pixel cell of claim 1, wherein the second-type PPD has a thickness substantially in a range from 10 nm to 200 nm.

4. The active pixel cell of claim 1, wherein the second-type PPD has a thickness substantially in a range from 30 nm to 50 nm.

5. The active pixel cell of claim 1, wherein the isolation feature comprises a silicon oxide, a trench isolation, silicon dioxide or a field oxide (FOX).

6. The active pixel cell of claim 1, wherein the second-type PPD has a doping concentration substantially in a range from $5 \times 10^{15}$ to $1 \times 10^{19}$ atoms/cm$^3$.

7. The active pixel cell of claim 1, wherein the first-type PPD is an n-type PPD and the second-type PPD is a p-type PPD.

8. A method for fabricating an active pixel cell on a semiconductor substrate with a top surface, the method comprising:
    providing an isolation feature in the top surface of the semiconductor substrate;
    forming a photodiode adjacent to the isolation feature, wherein the forming comprises:
        forming a first-type pinned photodiode (PPD) in the semiconductor substrate, wherein the first-type PPD has a first-type PPD surface coplanar with the top surface;
        forming a second-type PPD on the first-type PPD surface, wherein the second-type PPD has a second-type PPD surface which is elevated higher than the first-type PPD surface, and the first-type PPD is one of an n-type PPD and a p-type PPD, and the second-type PPD is the other one of the n-type PPD and the p-type PPD; and
        forming a protective oxide on and to cover the second-type PPD and contacts a portion of a top surface of the second-type PPD.

9. The method of claim 8, wherein the operation of forming the first-type PPD comprises forming the first-type PPD in the semiconductor substrate using an implanting process.

10. The method of claim 8, wherein the operation of forming the second-type PPD comprises forming the second-type PPD on the first-type PPD surface using an selective epitaxy growth (SEG) and in-situ doping process.

11. The method of claim 10, wherein the operation of using the selective epitaxy growth (SEG) and in-situ doping process forms the second-type PPD with a doping concentration, and the doping concentration is substantially in a range from $5 \times 10^{15}$ to $1 \times 10^{19}$ atoms/cm$^3$.

12. The method of claim 8, wherein the operation of forming the protective oxide forms protective oxide with a thickness, and the thickness is substantially in a range from 1 nm to 100 nm.

13. The method of claim 8, wherein the operation of forming the second-type PPD forms the second-type PPD with a thickness substantially in a range from 1 nm to 200 nm.

14. The method of claim 8, wherein the operation of forming the second-type PPD forms the second-type PPD with a thickness substantially in a range from 30 nm to 50 nm.

15. A method for fabricating an image sensor device, the method comprising:
    providing a semiconductor substrate with a top surface;
    forming an isolation feature disposed in the top surface to define a pixel region and a periphery region of the semiconductor substrate;
    forming a transistor gate and a gate structure respectively on the pixel region and the periphery region;
    doping first-type ions into the pixel region and the periphery region to form a first-type PPD and a first-type drain region in the pixel region, and to form a first-type source/drain region in the periphery region, wherein the transistor gate is between the first-type PPD and the first-type drain region, and the gate structure is between the first-type source/drain region, wherein the first-type PPD has a first-type PPD surface coplanar with the top surface;
    forming a second-type PPD on the first-type PPD surface, wherein the second-type PPD has a second-type PPD surface which is elevated higher than the first-type PPD surface, and the first-type PPD is one of an n-type PPD and a p-type PPD, and the second-type PPD is the other one of the n-type PPD and the p-type PPD; and
    forming a protective oxide on and to cover the second-type PPD and contact a portion of a top surface of the second-type PPD.

16. The method of claim 15, wherein the operation of forming the second-type PPD comprises forming the second-type PPD on the first-type PPD using a selective epitaxy growth (SEG) and in-situ doping process.

17. The method of claim 15, wherein the operation of forming the protective oxide forms protective oxide with a thickness, and the thickness is substantially in a range from 1 nm to 100 nm.

* * * * *